US009449120B2

(12) United States Patent
Abe et al.

(10) Patent No.: US 9,449,120 B2
(45) Date of Patent: Sep. 20, 2016

(54) COMPUTER PRODUCT, DATA PROCESSING METHOD, AND DATA PROCESSING DEVICE

(71) Applicant: FUJITSU LIMITED, Kawasaki-shi (JP)

(72) Inventors: Hideki Abe, Isehara (JP); Sachio Kobayashi, Sagamihara (JP); Hiroki Kobayashi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1001 days.

(21) Appl. No.: 13/660,043

(22) Filed: Oct. 25, 2012

(65) Prior Publication Data

US 2013/0144569 A1    Jun. 6, 2013

(30) Foreign Application Priority Data

Dec. 6, 2011   (JP) .................. 2011-267367

(51) Int. Cl.
*G06F 17/50* (2006.01)

(52) U.S. Cl.
CPC .................. *G06F 17/5004* (2013.01)

(58) Field of Classification Search
CPC .......................... G06F 17/50; G06F 17/5004
USPC ............................................................. 703/1
See application file for complete search history.

(56) References Cited

U.S. PATENT DOCUMENTS

| 5,945,995 A * | 8/1999 | Higuchi .................. G06T 17/10 345/420 |
| 2008/0059879 A1* | 3/2008 | Eri .......................... G06F 17/50 715/273 |
| 2008/0222568 A1* | 9/2008 | Okuwaki .................. G06F 17/50 715/825 |
| 2008/0292180 A1* | 11/2008 | Kobayashi ............. G06K 9/209 382/154 |
| 2009/0122059 A1* | 5/2009 | Katooka .................. G06T 15/10 345/420 |

FOREIGN PATENT DOCUMENTS

| JP | 3-42780 A | 2/1991 |
| JP | 10-213420 | 8/1998 |
| JP | 2002-063222 | 2/2002 |
| WO | WO-2008/126317 | 10/2008 |

OTHER PUBLICATIONS

Extraction of object, URL: http://www.gifu-nct.ac.jp/elec/yamada/iwata/cyu/index.html, partial translation from p. 1, line 1 to p. 2, line 16. (retrieved date: Jun. 27, 2011).
Japanese Office Action mailed Aug. 4, 2015 for corresponding Japanese Patent Application No. 2011-267367, with Partial English Translation, 4 pages.

* cited by examiner

*Primary Examiner* — Kamini S Shah
*Assistant Examiner* — Andre Pierre Louis
(74) *Attorney, Agent, or Firm* — Fujitsu Patent Center

(57) ABSTRACT

A computer-readable recording medium stores a program causing a computer to execute a data processing process that includes designating one plane data from a plane data group representing predetermined part data among part data expressed three dimensionally; setting at a position between a plane indicated by the designated plane data and a facing plane that faces the plane and is indicated by plane data other than the designated plane data, a first set plane that faces the plane; setting at a position on an opposite side of the plane from the facing plane, a second set plane that faces the plane; and acquiring projection control information for projecting in a projection direction from any one among the first and second set planes toward the other set plane, a part group located between the first and second set planes and indicated by a part data group among the plural part data.

15 Claims, 24 Drawing Sheets

FIG.17
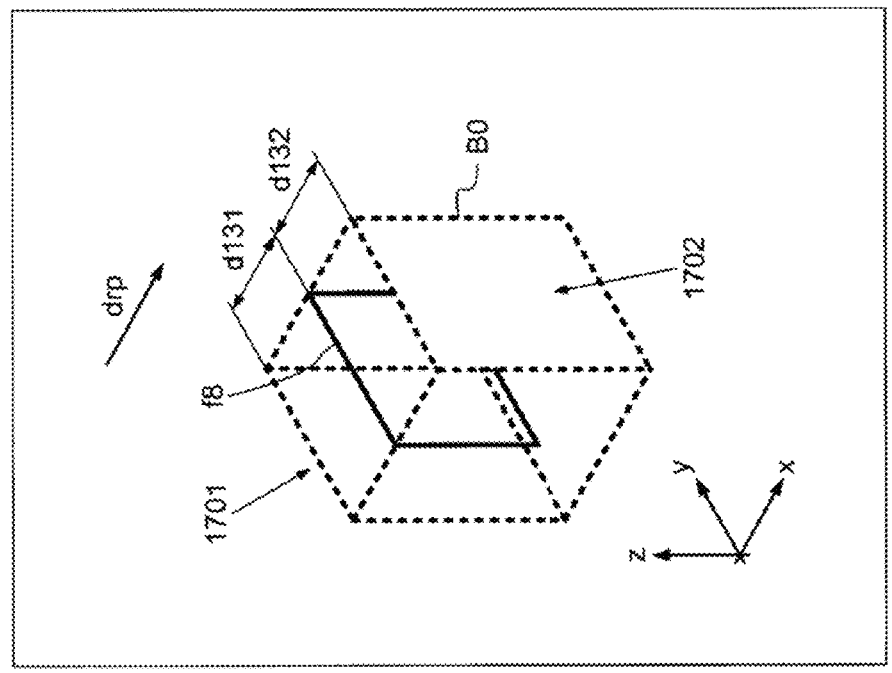
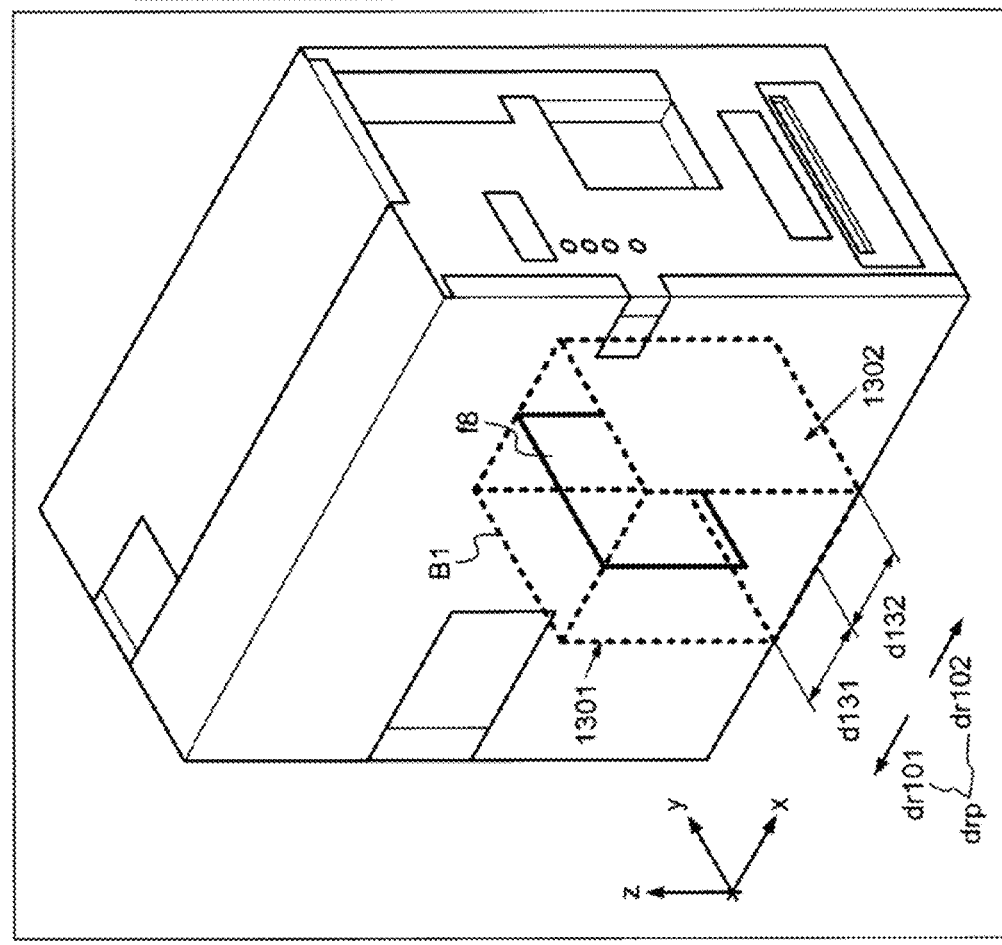

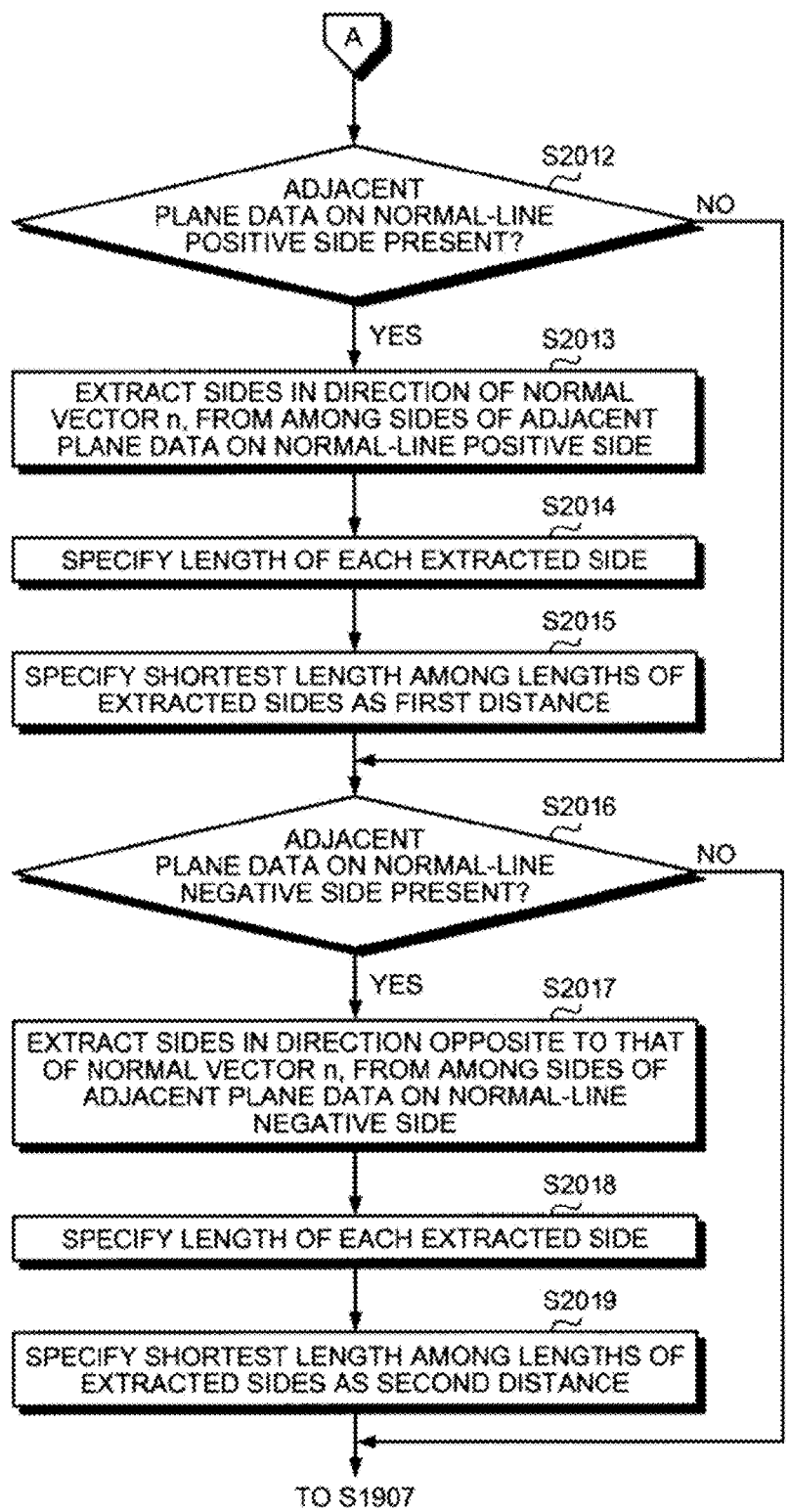

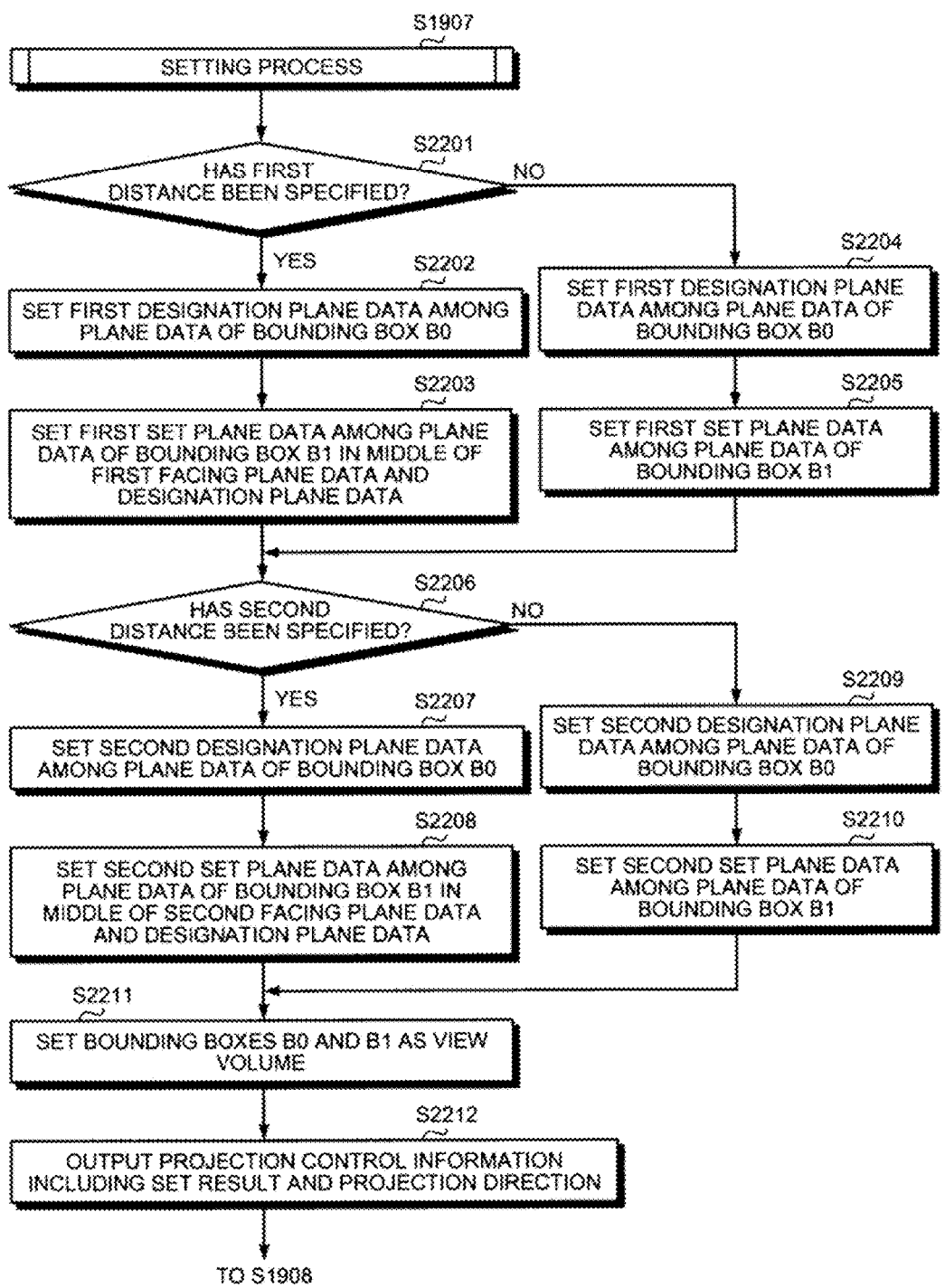

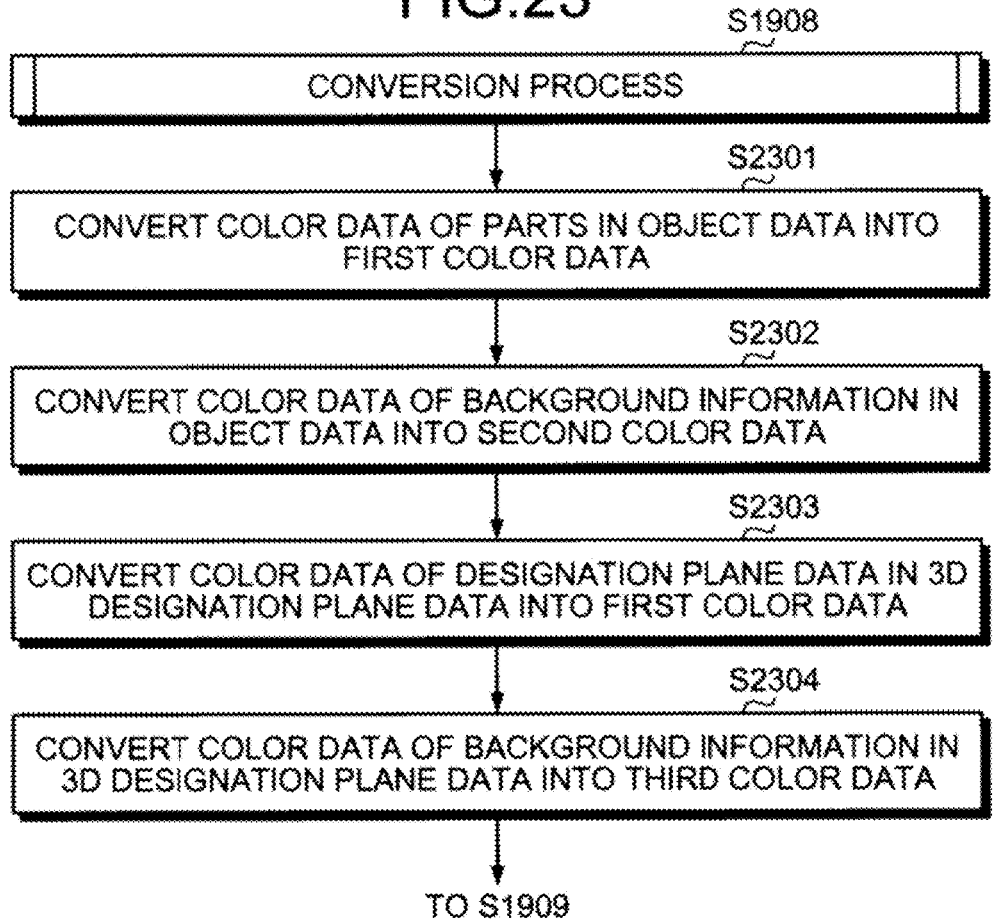

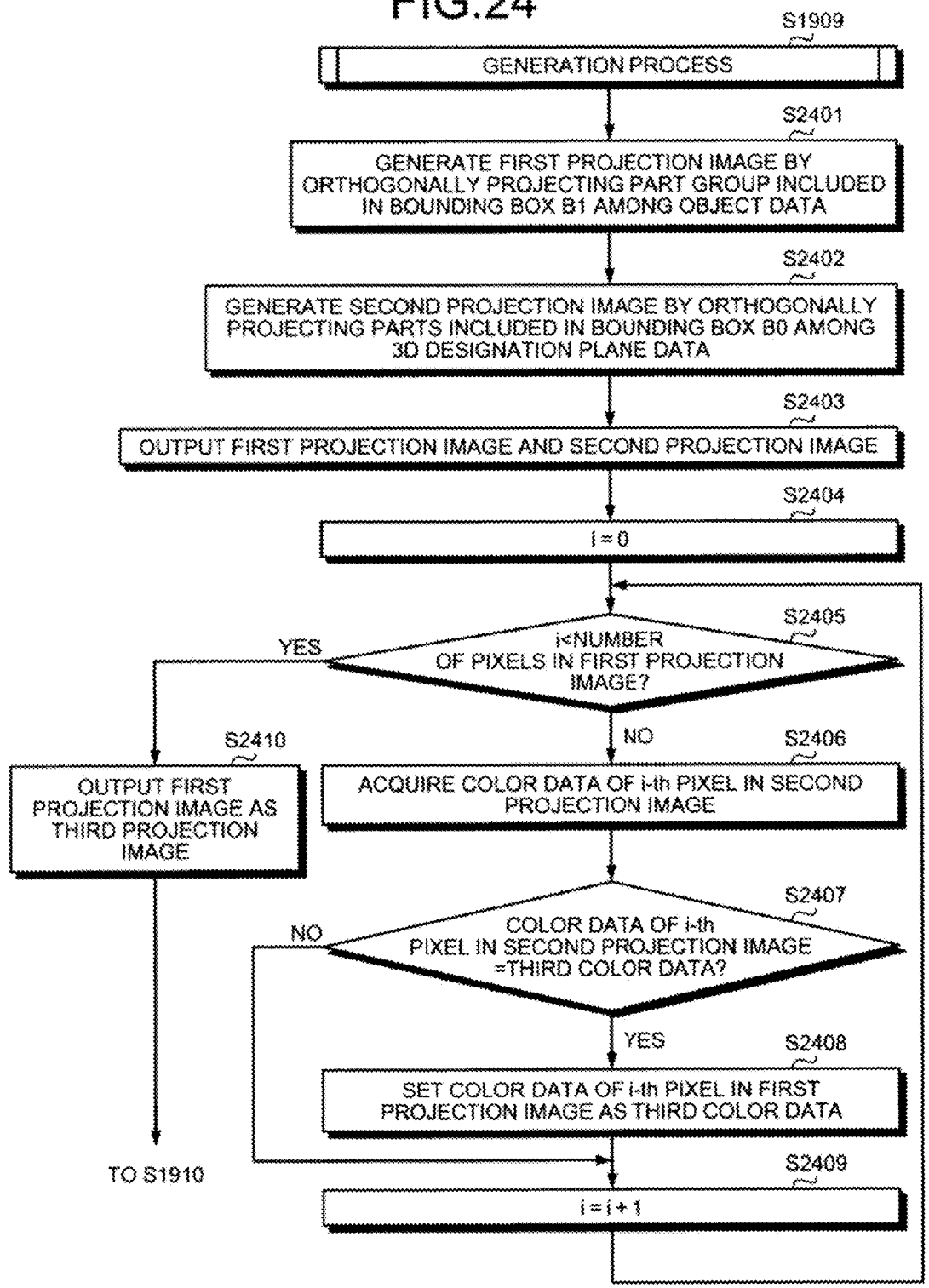

COMPUTER PRODUCT, DATA PROCESSING METHOD, AND DATA PROCESSING DEVICE

CROSS REFERENCE TO RELATED APPLICATIONS

This application is based upon and claims the benefit of priority of the prior Japanese Patent Application No. 2011-267367, filed on Dec. 6, 2011, the entire contents of which are incorporated herein by reference.

FIELD

The embodiments discussed herein are related to data processing.

BACKGROUND

In conventional development of mechanical products, the mechanical products are designed using three-dimensional (3D) computer aided design (CAD) data. A 3D CAD tool having a projection function can convert 3D CAD data into two-dimensional (2D) data. Furthermore, holes in parts of mechanical products are detected in the conventional development of mechanical products.

Related conventional techniques include a technique that enables to capture an image of a hole formed in an object by using a camera and to create a reference image for pattern matching with the captured image. For example, there is a technique that enables to convert 3D CAD data of an object into 2D data and to recognize a closed curve in the converted 2D data as a hole shape. A technique that enables to extract a surface of an object formed by combining multiple parts, from among 3D CAD data related to the object, to check contact relations between edge lines of part data included in the extracted surface and other surfaces, and to detect an edge line that has no significant contact with other part data and satisfies a predetermined condition as a clearance or a hole is another example.

For examples of such techniques, refer to Japanese Laid-Open Patent Publication Nos. H10-213420 and 2002-63222, and Published Japanese-Translation of PCT Application, Publication No. 2008/126317

However, when a part data group G in 3D object data of an object including multiple part data such as 3D CAD data is to be projected, a hole in part data "a" in the part data group G may be hidden by part data b located outside the part data group G to face the part data "a". In this case, if a projection range is set to project only the part data group G, a connection relation between the part data group G and part data outside the part data group G, positional information of the part data b outside the part data group G, and the like need to be detected, which increases processing loads. Therefore, it is difficult to automatically set a projection range not to include the part data b that interferes with projection of the part data "a" in the part data group G.

SUMMARY

According to an aspect of an embodiment, a computer-readable recording medium stores a program that causes a computer to execute a data processing process that includes designating one plane data from a plane data group representing predetermined part data among a plurality of part data expressed three dimensionally; setting at a position between a plane indicated by the designated plane data and a facing plane that faces the plane and is indicated by plane data in the plane data group other than the designated plane data, a first set plane that faces the plane; setting at a position on an opposite side of the plane from the facing plane, a second set plane that faces the plane; and acquiring projection control information for projecting in a projection direction from any one among the first and second set planes toward the other set plane, a part group located between the first and second set planes and indicated by a part data group among the plural part data.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 17 is an explanatory diagram depicting an example of setting of the first set plane and the second set plane according to a third embodiment;

FIGS. 20 and 21 are flowcharts depicting detailed explanations of a specification process (step S1906) in FIG. 19;

FIG. 22 is a flowchart depicting detailed explanations of a setting process (step S1907) depicted in FIG. 19;

FIG. 23 is a flowchart depicting detailed explanations of a conversion process (step S1908) depicted in FIG. 19; and FIG. 24 is a flowchart depicting detailed explanations of a generation process (step S1909) depicted in FIG. 19.

DESCRIPTION OF EMBODIMENTS

Embodiments of a data processing program, a data processing method, and a data processing device according to the present invention will be described below with reference to the accompanying drawings. In the embodiments, "plane" indicates an object represented by modeling in 3D graphics, for example. "Plane data" indicate data that specifies a plane, such as vertex coordinates of the plane. Therefore, a plane is drawn using the plane data. Similarly, "part" indicates an object represented by modeling in the 3D graphics, for example. "Part data" indicate data that specifies a part, such as vertex coordinates of the part or normal lines of planes that constitute the part. Therefore, a part is drawn using the part data.

Figure 1:
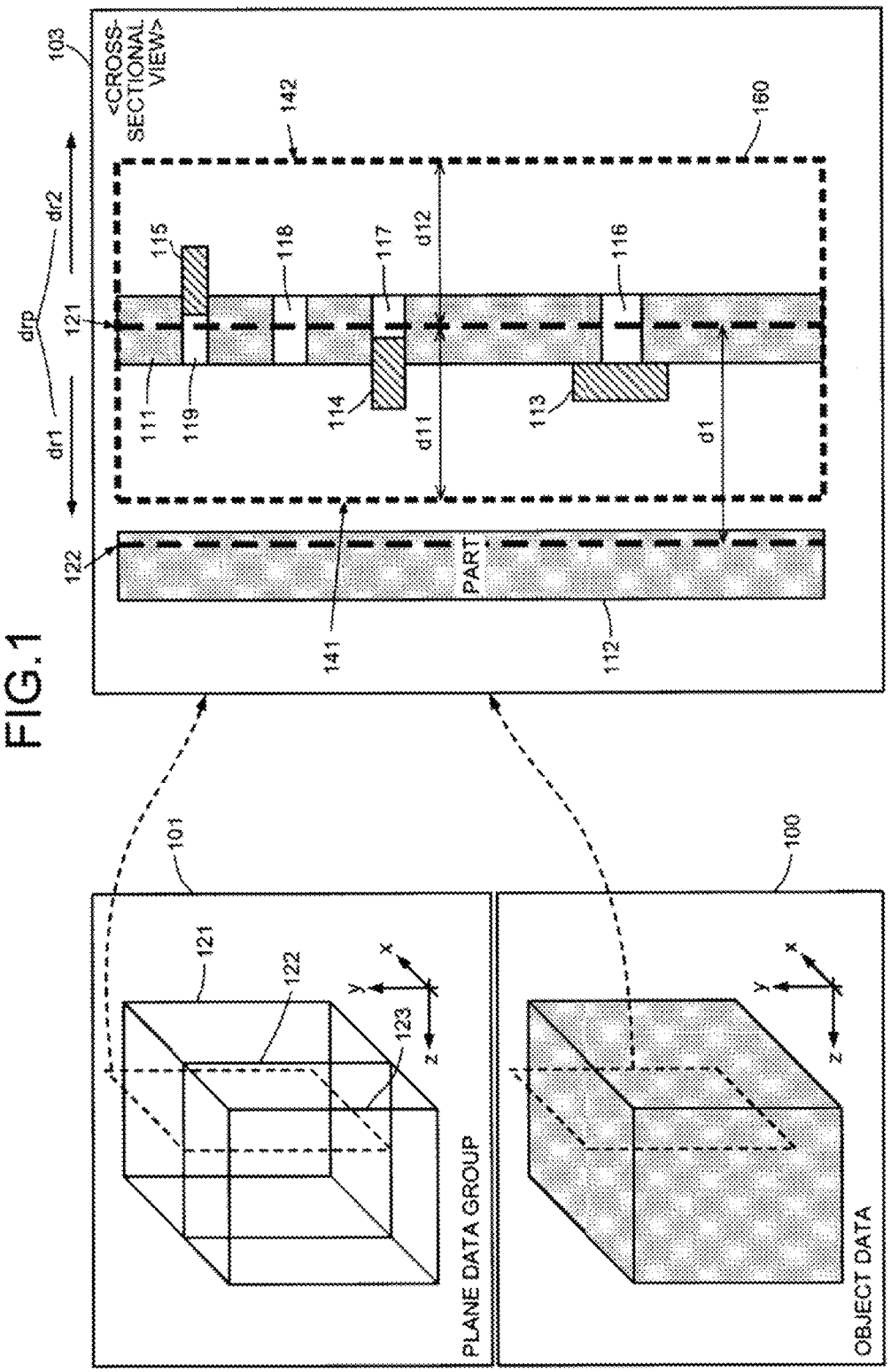
FIG. 1 is an explanatory diagram depicting a setting example of a projection range according to each embodiment.

FIG. 1 is an explanatory diagram depicting a setting example of a projection range according to an embodiment. Prior to setting by a data processing device, 3D object data 100 and a plane data group 101 are described. The object data 100 are for example 3D CAD data including part data that represent multiple parts constituting an object, respectively. Each of the part data includes shape data, position data, color data, and the like of a part. The object is an object in the 3D graphics of a mechanical product such as a PC (Personal Computer), a server, a personal digital assistant, an automobile, a home electric appliance, or the like, or a construction such as a building. A 3D orthogonal coordinate system including an X axis, a Y axis, and a Z axis is defined in the object data 100. For example, the object data 100 is stored in a storage device that can be accessed by the data processing device.

The plane data group 101 is a collection of plane data. Each of the plane data in the plane data group 101 is acquired by approximating or abstracting each of typical part data (main part data) constituting the object data 100 among the plural part data included in the object data 100, for example. When the object data 100 is for a PC, main part data for side panels, a top panel, a bottom panel, a main partition plate that partitions inside of the PC, and the like are included in the object data 100.

For example, small parts included in an object are less likely to interfere with projection and thus part data of a size equal to or larger than a predetermined value can be defined as the typical part data. When the object data 100 indicate a PC, small parts included in the object data 100 are screws for connecting parts, slots into which a board is inserted, and the like. By excluding part data related these parts from the typical part data, plane data related to the small part data included in the object data 100 are eliminated from the plane data group 101. The typical part data can be selected by a user from the object data 100, for example.

An example of the plane data in a case where hole information is used in an acoustic vibration analysis according to a SEA (Statistical Energy Analysis) method is described. In the acoustic vibration analysis, to analyze attenuation of sound that hits a wall in an object or sound that leaks from a hole of the wall, it is desirable that the object data 100 be divided at a position where there is the wall. It is highly possible that a wall is located at a position where there is part data in the object data 100. Accordingly, a computer can create the plane data group 101 by creating plane data of each of part data that are acquired by dividing the object data 100 at the position where the wall is located. Alternatively, a user can manually create the plane data group 101 based on the object data 100.

For example, each of the plane data has information of multiple vertices that constitute a plane, for example. The information of vertices is coordinate data, for example. The vertices are any four or more vertices among vertices c1 to c12. A plane indicated by each of the plane data can be overlapped with, contacted with, or located slightly away from respective part data corresponding to the plane data.

For example, plane data s1 indicating a plane 121 includes information of vertices c3, c4, c10, and c19 as constituent vertices. That is, the plane 121 is an area enclosed in the constituent vertices c3, c4, c10, and c19. For example, plane data s2 indicating a plane 122 includes information of vertices c2, c8, c11, and c5 as constituent vertices. That is, the plane 122 is an area enclosed in the constituent vertices c2, c8, c11, and c5. For example, plane data s3 indicating a plane 123 includes information of vertices c1, c7, c12, and c6. That is, the plane 123 is an area enclosed in the vertices c1, c7, c12, and c6.

A distance between two planes that face each other can be previously set not to be shorter than a specific distance at the time of creation of the plane data group 101. For example, the specific distance can be a smallest one of thicknesses of parts indicated by the part data constituting the object data 100. This prevents a state where no projection can be performed due to such a narrow projection range. For example, when two planes indicated by the plane data face each other in the object data 100, it is assumed that part data that interfere with projection are not independently located between the two planes.

Furthermore, the same orthogonal coordinate system as the 3D orthogonal coordinate system defined in the object data 100 is defined in the plane data group 101, for example. When a plane indicated by certain plane data and a plane indicated by another plane data are adjacent to each other in the 3D orthogonal coordinate system, it is assumed that these two planes are orthogonal or parallel to each other. For example, the plane data group 101 is stored in a storage device that can be accessed by the data processing device.

In a cross-sectional view 103 in FIG. 1, part data in a partial cross-section of the object data 100 and planes indicated by plane data related to the part data in the partial cross-section among the plane data group 101 are represented. The part data in the partial cross-section of the object data 100 are part data 111, part data 113 to 115, and part data 112. The planes indicated by the plane data related to the part data in the partial cross-section are the plane 121 that is indicated by the plane data s1 related to the part data 111 and the facing plane 122 that is indicated by the plane data s2 related to the part data 112. Because the plane data group 101 does not include plane data related to small part data such as the part data 113 to 115, planes indicated by plane data related to the part data 113 to 115, respectively, are not included in the cross-sectional view 103.

In the cross-sectional view 103, for example, the part data 113 is located to cover a hole 116 of a part indicated by the part data 111 and thus the hole 116 is closed. For example, the part data 113 is larger than the hole 116. In the cross-sectional view 103, the part data 114 is located at a position of a hole 117 of the part data 111 and thus the hole 117 is closed, for example. In the cross-sectional view 103, for example, the part data 115 is located at a position of a hole 119 of the part data 111 and thus the hole 119 is closed. In the cross-sectional view 103, for example, a hole 118 is not closed. In the cross-sectional view 103, for example, the part data 112 faces the part data 111 and does not close any of the holes in the part data 111.

To set a projection range, the data processing device first acquires the object data 100 and the plane data group 101 from the storage device that has the object data 100 and the plane data group 101 stored therein. The data processing device designates one of plane data from the plane data group 101. For example, the user determines part data in the object data 100 as a projection subject from the plane data group 101, and inputs designation of plane data related to the part data as the projection subject from the plane data group 101 to the data processing device. The data processing device can designate plane data from the plane data group 101 based on the designation input by the user. Alternatively, the data processing device can arbitrarily designate plane data from the plane data group 101, or can designate plane data in turn from the plane data group 101. In this case, the data processing device designates the plane data s1 from the plane data group 101.

The data processing device sets a first set plane 141 that faces the plane 121 indicated by the designated plane data s1 and the facing plane 122 that is indicated by the plane data s2 other than the plane data s1 in the plane data group 101 and faces the plane 121, at a position between the plane 121 and the facing plane 122. The facing plane 122 is a plane indicated by the plane data s2 related to the part data 112 different from the part data 111. The facing plane 122 is not limited thereto. When the part data 111 is U-shaped, there may be multiple plane data related to the part data 111 and thus the facing plane 122 can be a plane indicated by the plane data related to the part data 111.

For example, the data processing device can acquire a distance d1 between the plane 121 and the facing plane 122 that faces the plane 121 and set the first set plane 141 based on the acquired distance d1. For example, the data processing device sets the first set plane 141 to cause a distance d11 to be shorter than the distance d1, so that the first set plane 141 is set between the facing plane 122 and the plane 121. Alternatively, the data processing device can set the first set plane 141 at a position that causes the distance d11 to be substantially half the distance d1, for example. That is, the data processing device sets the first set plane 141 in the middle between the plane 121 and the facing plane 122 that faces the plane 121.

For example, the data processing device can acquire the distance d1 between the plane 121 and the facing plane 122 by calculating a difference between position data included in the plane data s1 that indicates the plane 121 and position data included in the plane data s2 that indicates the facing plane 122. Alternatively, distances between two planes that face each other and are indicated by the respective plane data in the plane data group 101 can be previously stored in the storage device and the data processing device can acquire the distance d1 between the plane 121 and the facing plane 122 from the storage device, for example.

The data processing device sets a second set plane 142 that faces the facing plane 122 at a position on an opposite side of the plane 121 from the facing plane 122. For example, the data processing device can set the second set plane 142 based on the distance d11 between the plane 121 and the first set plane 141 that has been already set. For example, the data processing device can set the second set plane 142 to cause a distance d12 to be equal to the distance d11. Alternatively, the data processing device can set the second set plane 142 based on a predetermined distance stored in the storage device, for example. While there is no part on the opposite side of the plane 121 from the facing plane 122, setting of the second set plane 142 increases likelihood that a part indicated by the part data 115 and located at the position of the hole 119 of a part indicated by the part data 111 is included in a projection subject, for example.

A projection direction drp is a direction from one of the first set plane 141 and the second set plane 142 toward the other set plane. A direction from the first set plane 141 toward the second set plane 142 is a direction dr2. A direction from the second set plane 142 toward the first set plane 141 is a direction dr1. The projection direction drp (the direction dr1 or dr2) is a direction passing through the plane 121 (a direction orthogonal to the plane 121, for example).

The data processing device outputs projection control information for projecting a part group indicated by a part data group located between the first set plane 141 and the second set plane 142 among the object data 100 in the projection direction drp, to a projection unit that executes a projection process. A cuboid from the first set plane 141 to the second set plane 142 is a view volume which is a projection range 160. The part data group located between the first set plane 141 and the second set plane 142 is the part data 111 and the part data 113 to 115.

Examples of the projection unit include an API (application program interface) related to the projection process. Although the projection process is not particularly limited, shapes of holes can be more accurately projected in orthogonal projection that enables vertical projection with respect to the first set plane 141 or the second set plane 142 than in other types of projection.

Although not depicted, the data processing device can set the first set plane 141 between the plane 121 and the facing plane 123 that faces the plane 121 and is indicated by the plane data s3 other than the plane data s1 indicating the plane 121 among the plane data group 101.

The distance from the plane 121 to the facing plane 122 is shorter than a distance from the plane 121 to the facing plane 123. Therefore, the data processing device sets the first set plane 141 at a position between the plane 121 and the facing plane 122 that faces the plane 121 the shortest distance away from the plane 121 in the plane data group 101. That is, the data processing device can set the projection range 160 that does not include the part data 112 corresponding to the facing plane 122 the shortest distance away from the plane 121 even when the part data 112 is located at the shortest distance.

Figure 2:
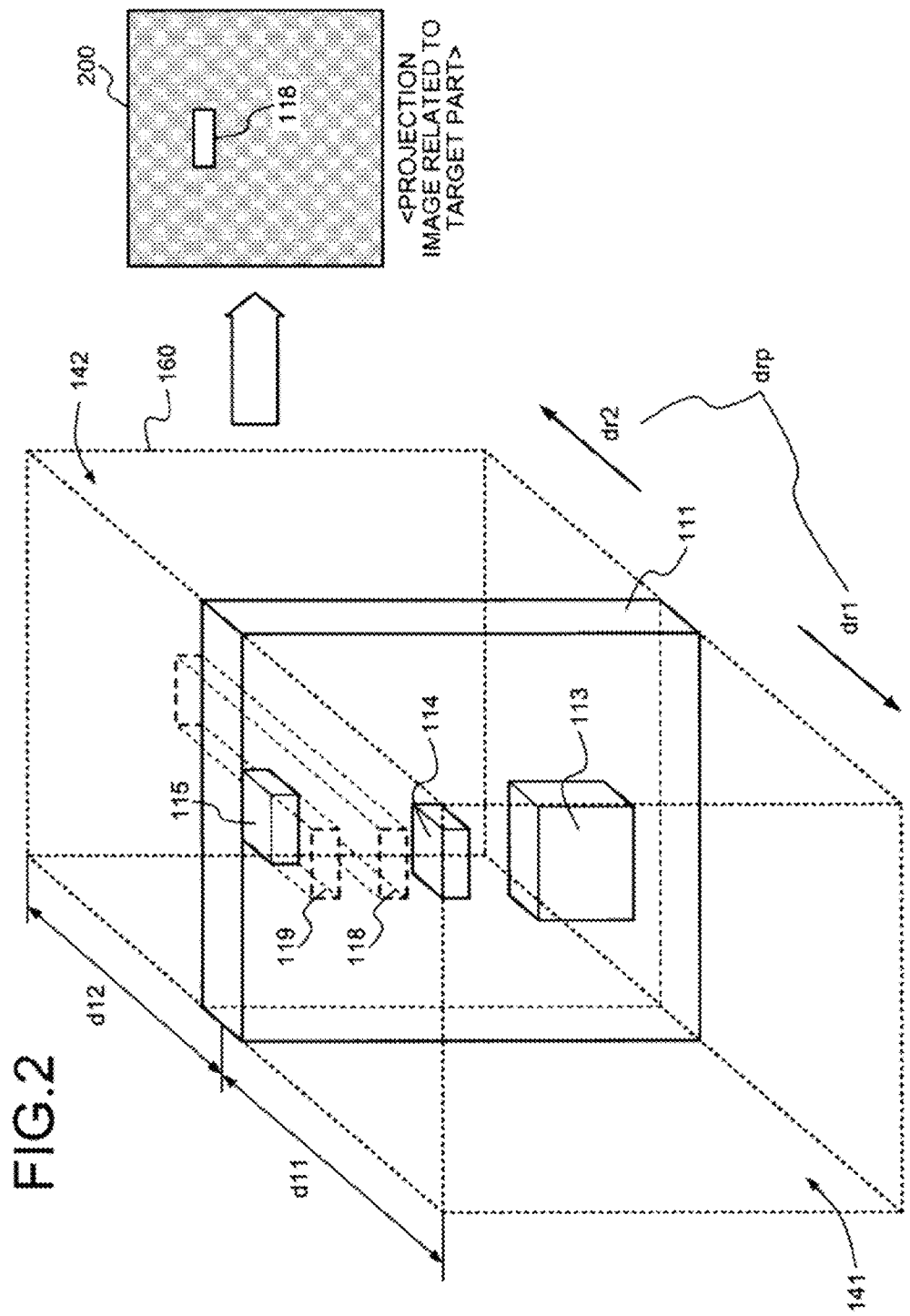
FIG. 2 is an explanatory diagram depicting a detailed example of a projection range 160 set in FIG. 1.

FIG. 2 is an explanatory diagram depicting a detailed example of the projection range 160 set in FIG. 1. In FIG. 2, the projection range 160 set in FIG. 1 and a part group included in the projection range 160 among the object data 100 are depicted.

The data processing device projects the part group included in the projection range 160 among the object data 100 in the projection direction drp, thereby generating a projection image 200. Because there is no significant difference in the projection images 200 generated in the projection process between when the projection direction drp is the direction dr2 and when the projection direction drp is the direction dr1, the projection direction drp is not particularly limited. While the type of projection is not particularly limited, shapes of holes can be more accurately projected in the orthogonal projection that enables vertical projection with respect to the first set plane 141 or the second set plane 142 than in the other types of projection.

For example, color data of the part data group between the first set plane 141 and the second set plane 142 among the object data 100 can be same color data. The color data is information represented by RGB (Red, Green, and Blue), for example. Accordingly, in the projection image 200, the hole 118 that is not closed is projected and all portions other than the hole 118 are same color data. An example in which an unsuitable projection range is set is depicted in FIG. 3 to facilitate understanding.

Figure 3:
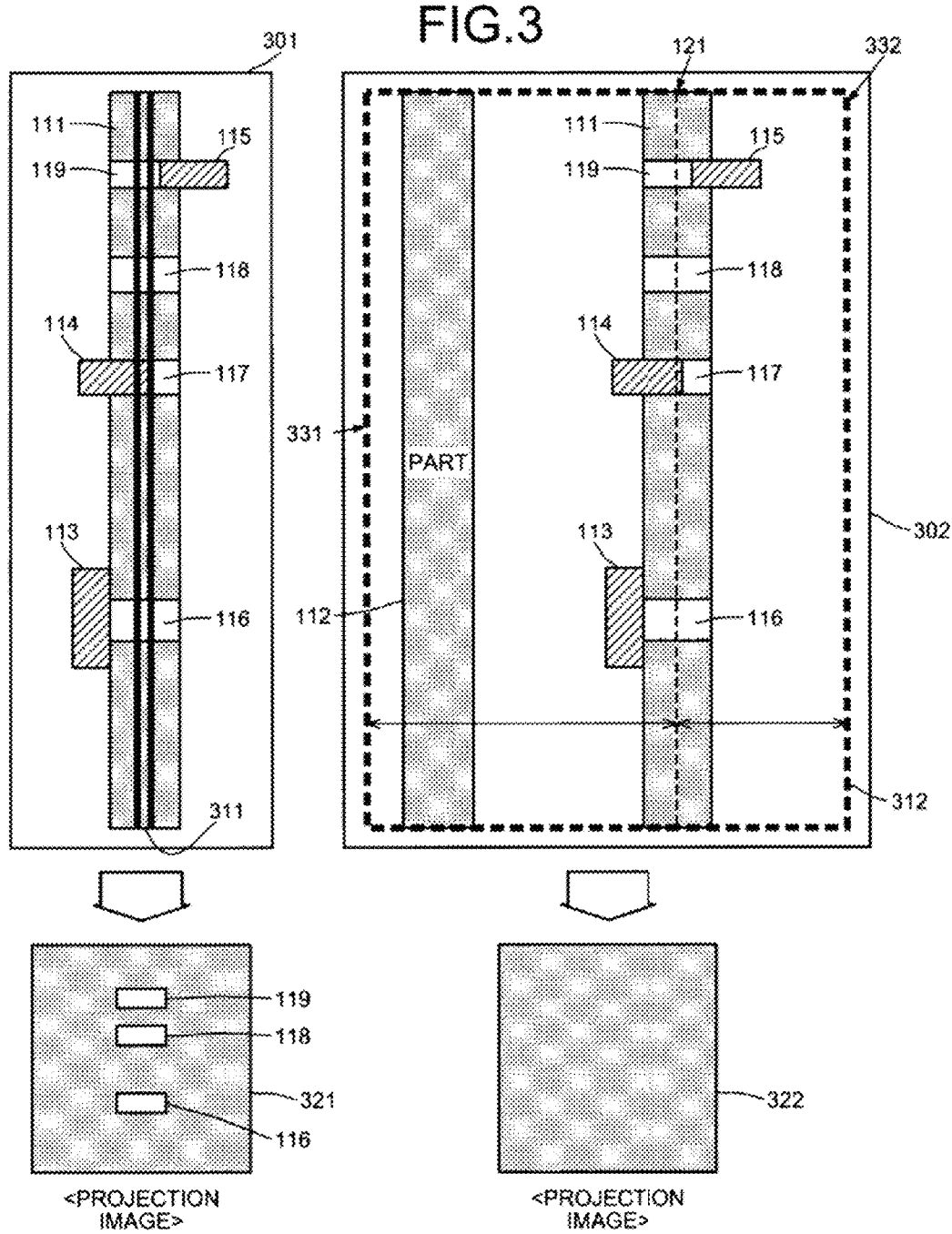
FIG. 3 is an explanatory diagram depicting an example in which a projection range is unsuitable.

FIG. 3 is an explanatory diagram depicting an example in which a projection range is unsuitable. A cross-sectional view 301 depicts a case in which a projection range 311 is only a small range that overlaps with the part data 111. The hole 118 is projected in a projection image 321 that is acquired by performing projection transform in the projection range 311 in the case of the cross-sectional view 301. Furthermore, in the projection image 321, the hole 119 that is closed by connecting the part data 115 to the part data 111 is projected and the hole 116 that is closed by connecting the part data 113 to the part data 111 is projected.

In a cross-sectional view 302, a projection range 312 from a first set plane 331 to a second set plane 332, which are set at arbitrary positions, is depicted. A distance from the plane 121 to the first set plane 331 is longer than a distance from the plane 121 to a front plane of the part data 112. The projection range 312 includes the part data group (the part data 111, the part data 113 to 115, and the part data 112). A part group indicated by a part data group included in the projection range 312 among the object data 100 is orthogonally projected from the first set plane 331 toward the second set plane 332. Parts indicated by the part data 111 and the part data 113 to 115 are hidden by a part indicated by the part data 112 and thus the hole 118 is not projected.

When the part group indicated by the part data group (111 to 115) included in the projection range 312 among the object data 100 is orthogonally projected from the second set plane 332 toward the first set plane 331, the hole 118 is not projected due to the part indicated by the part data 112. That is, although not closing any of the holes of the part indicated by the part data 111, the part indicated by the part data 112 hides the part data 111 and the holes of the part data 111 at the time of projection when it is included in the projection range 312. Therefore, the part indicated by the part data 112 interferes with projection of the part indicated by the part data 111.

For example, when all of the color data of the part data are same color data, the projection image 322 is an image only including the color data of the part data. Therefore, the hole 118 does not appear in the projection image 322 and thus the data processing device cannot detect hole information of the hole 118 from the projection image 322.

As depicted in FIG. 3, when the projection range is arbitrarily set, the projection range may be too narrow or too wide. Therefore, the part that is indicated by the part data 112 and may interfere with projection of the part group indicated by the part data group (111 and 113 to 115) may be included in the projection range. For example, when seeing the projection image 322, the user cannot determine whether there is no hole formed by the part data group included in the projection range 312 or a part indicated by the part data group is hidden by the part indicated by the part data 112 and thus a hole is not projected. Accordingly, the user can manually set a projection range to accurately exclude the interfering part from the projection range; however, this is laborious for the user.

For example, when the first set plane 141 is set between the plane 121 and the facing plane 122 that is not at the shortest distance from the plane 121, the first set plane 141 may be set at the same position as the first set plane 112.

Therefore, the first set plane 141 is set between the plane 121 and the facing plane 122 that is at the shortest distance from the plane 121 as mentioned above. This enables the user to acquire the projection control information not including part data that corresponds to facing plane data indicating the facing plane at the shortest distance even when the part data is at the shortest distance.

For example, if the first set plane 141 is set at a position closer to the part data 112 than the part data 111 even when the first set plane 141 is between the plane 121 and the facing plane 122, the projection range 160 may include the part data 112 as the projection range 312 in FIG. 3. Accordingly, the first set plane 141 is set in the middle of the plane 121 and the facing plane 122 as mentioned above, so that the part data 112 can be excluded from the projection range 160 as much as possible.

For example, if the first set plane 141 is set at a position closer to the part data 111 than the part data 112 even when the first set plane 141 is between the plane 121 and the facing plane 122, the projection range 160 may not include the part data 113 as the projection range 311 in FIG. 3. Accordingly, the first set plane 141 is set in the middle of the plane 121 and the facing plane 122 as mentioned above, so that the part data 113 can be included in the projection range 160 as much as possible.

In the example depicted in FIGS. 1 and 2, the projection range 160 that does not include the part data 112 corresponding to the facing plane 122 is automatically set. That is, the data processing device can enhance setting accuracy of the projection range in the example depicted in FIGS. 1 and 2. Accordingly, when a through hole passes in the projection direction through any part in the part group indicated by the part data group within the projection range, or a clearance is formed by multiple parts in the part group, information related to the through hole or the clearance can be detected from the projection image.

The information related to the through hole or the clearance is used as a parameter when the acoustic vibration analysis or a fluid analysis is performed, for example. The information related to the through hole or the clearance includes an area, a shape, a perimeter, a circularity degree, a gravity center, and the like. Furthermore, when the projection range is set by using the plane data group prepared in advance, a calculation amount required for the setting process can be reduced.

Figure 4:
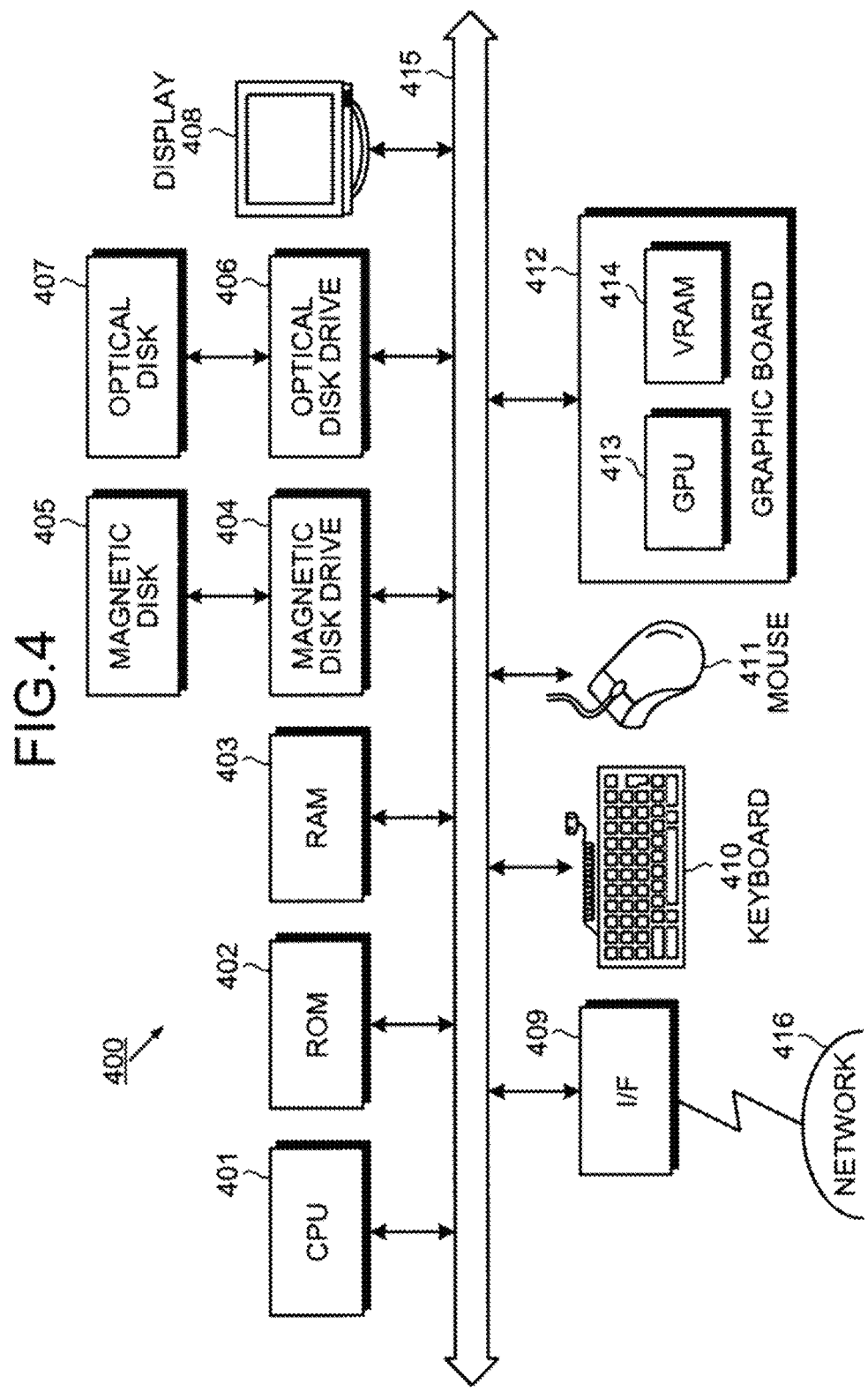
FIG. 4 is a block diagram of a hardware configuration of a data processing device 400 according to the embodiments.

FIG. 4 is a block diagram of a hardware configuration of a data processing device 400 according to the embodiments. As depicted in FIG. 4, the data processing device 400 includes a central processing unit (CPU) 401, a read-only memory (ROM) 402, a random access memory (RAM) 403, a magnetic disk drive 404, a magnetic disk 405, an optical disk drive 406, an optical disk 407, a display 408, an interface (I/F) 409, a keyboard 410, a mouse 411, and a graphic board 412, respectively connected by a bus 415.

The CPU 401 governs overall control of the data processing device 400. The ROM 402 stores therein programs such as a boot program. The RAM 403 is used as a work area of the CPU 401. The magnetic disk drive 404, under the control of the CPU 401, controls the reading and writing of data with respect to the magnetic disk 405. The magnetic disk 405 stores therein data written under control of the magnetic disk drive 404.

The optical disk drive 406, under the control of the CPU 401, controls the reading and writing of data with respect to the optical disk 407. The optical disk 407 stores therein data written under control of the optical disk drive 406, the data being read by a computer.

The display 408 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 408.

The I/F 409 is connected to a network 414 such as a local area network (LAN), a wide area network (WAN), and the Internet through a communication line and is connected to other apparatuses through the network 414. The I/F 409 administers an internal interface with the network 414 and controls the input/output of data from/to external apparatuses. For example, a modem or a LAN adaptor may be employed as the I/F 409.

The keyboard 410 includes, for example, keys for inputting letters, numerals, and various instructions and performs the input of data. Alternatively, a touch-panel-type input pad or numeric keypad, etc. may be adopted. The mouse 411 is used to move the cursor, select a region, or move and change the size of windows. A track ball or a joy stick may be adopted provided each respectively has a function similar to a pointing device.

The graphic board 412 includes a graphic processing unit (GPU) 413 and video RAM (VRAM) 414. The GPU 413 is an integrated circuit having a computing device specialized for image data processing. The VRAM 414 is RAM used as memory for video display portions displayed in a display. The GPU 413 is connected to the VRAM 414 and stored computation results to the VRAM 414.

Figure 5:
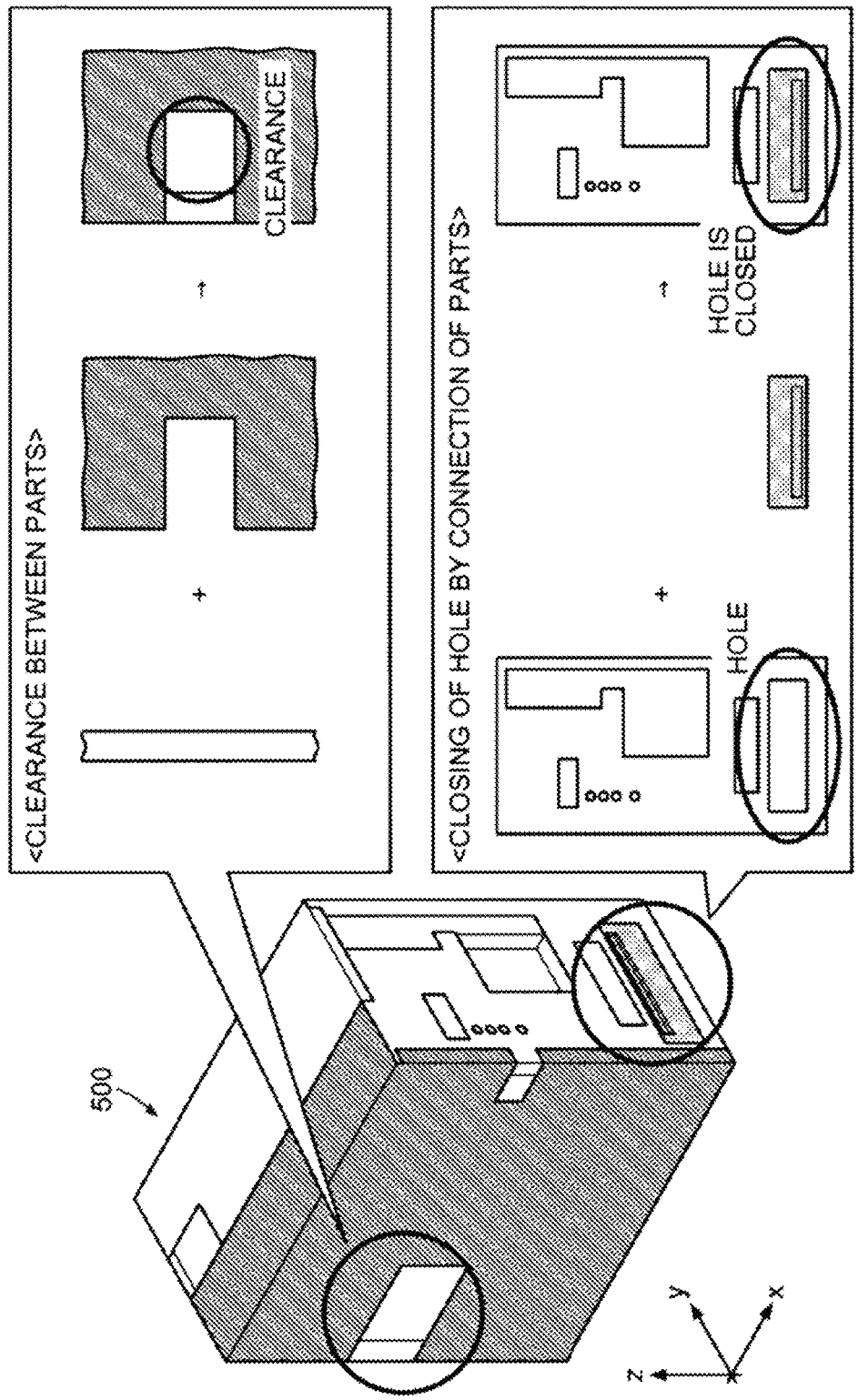
FIG. 5 is an explanatory diagram depicting an example of object data.

FIG. 5 is an explanatory diagram depicting an example of object data. Object data 500 is 3D CAD data including part data indicating plural parts that constitute an object, for example, as mentioned above. Each of the part data includes shape data, position data, color data, and the like, of a part. The shape data includes information for specifying a shape of the part, for example. The position data includes information for specifying an arrangement position of the part in a 3D orthogonal coordinate system, for example. The color data is information related to a color represented by RGB, for example. A 3D orthogonal coordinate system including an X axis, a Y axis, and a Z axis is defined in the object data 500. In FIG. 5, a PC is illustrated as an example of the object.

The object data 500 depicts an example in which a clearance is formed by connecting parts although each part does not have a hole. Furthermore, the object data 500 depicts an example in which a hole formed in a part is closed by connection of another part.

The object data 500 can be stored in the storage device such as the ROM 402, the RAM 403, the magnetic disk 405, or the optical disk 407 depicted in FIG. 4. The object data 500 can be stored in a storage device included in an external device that can be accessed by the CPU 401 through the network 416.

A plane data group is described below. Plane data is information indicating a plane related to the part data in the object data 500. In the first embodiment, the plane data has multiple vertex data constituting the plane. The vertex data are described first.

Figure 6:
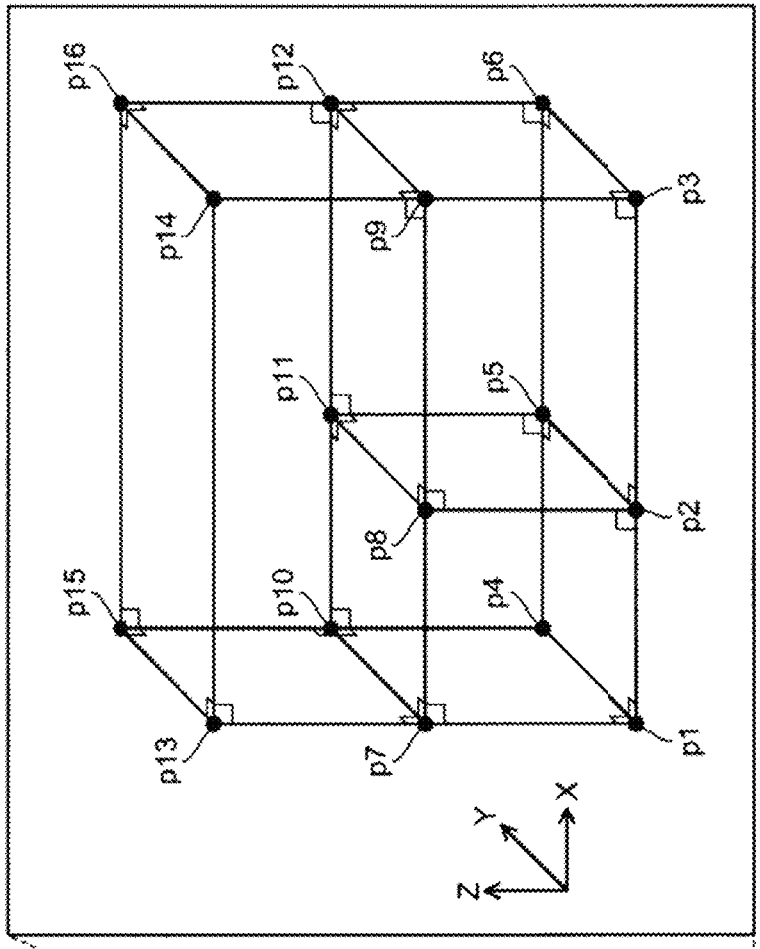
FIG. 6 is an explanatory diagram depicting an example of vertex data.

FIG. 6 is an explanatory diagram depicting an example of the vertex data. In FIG. 6, vertex data 600 are position data of typical vertices p1 to p16 in the object data 500. In the vertex data 600, the same 3D orthogonal coordinate system as that defined in the object data 500 is defined. The position data are information depicting coordinate positions in the 3D orthogonal coordinate system. Regarding the vertex p1 as an example, coordinates v1 of the vertex p1 are depicted as v1=(X, Y, Z)=(0, 0, 0). A specific example of the plane data is depicted in FIG. 7.

Figure 7:
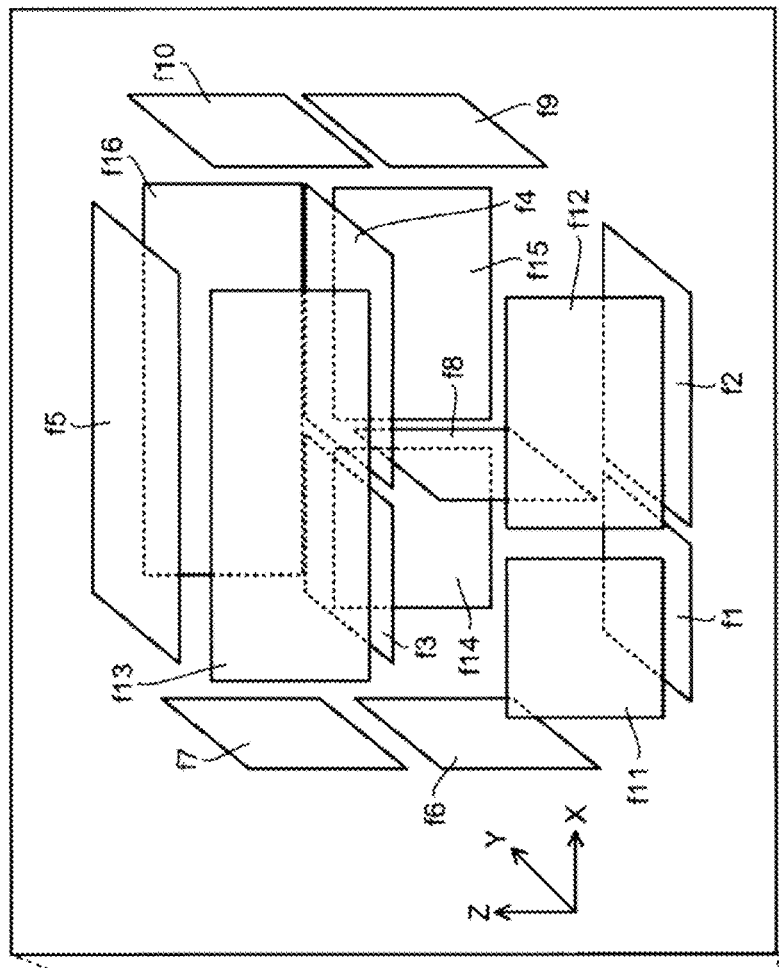
FIG. 7 is an explanatory diagram depicting an example of a plane data group.

FIG. 7 is an explanatory diagram depicting an example of the plane data group. In FIG. 7, a plane data group 700 includes plane data f1 to f16 indicating planes F1 to F16 related to some typical parts among the plural parts indicated by the plural part data in the object data 500, respectively. Each of the part data indicating some typical parts can be part data larger than a predetermined size in the object data 500 as mentioned above, or part data selected based on determination of the user. As mentioned above, the object is a PC in the object data 500. Accordingly, the parts corresponding to some typical part data include the side panels, the top panel, the bottom panel, and the main partition plate that partitions inside of the PC, which are main parts constituting the PC, as mentioned above. The plane data group 700 does not include plane data related to small part data included in the PC, or the like.

A plane indicated by each of the plane data is an area enclosed by multiple vertices on a flat plane. Regarding the plane F1 indicated by the plane data f1 as an example, vertices constituting the plane F1 are vertices p1, p2, p5, and p4. That is, the plane F1 is an area enclosed by a side of a line connecting the vertices p1 and p2, a side of a line connecting the vertices p2 and p5, a side of a line connecting the vertices p5 and p4, and a side of a line connecting the vertices p4 and p1. For example, the constituent vertices of the plane data are arranged in an order of forming the sides.

In the plane data group 700, it is assumed that when a plane indicated by plane data and a plane indicated by another plane data are adjacent to each other in the 3D orthogonal coordinate system, these two planes are orthogonal or parallel to each other. The plane data group 700 can be created by causing a computer to extract vertices based on the shape data of the parts or can be manually created by the user. It is assumed that, between two planes that face each other, there is no part other than parts corresponding to plane data that indicate the two planes and parts connected to these parts in the object data 500. The plane data group 700 and the vertex data 600 can be stored in the storage device such as the ROM 402, the RAM 403, the magnetic disk 405, or the optical disk 407 depicted in FIG. 4. The plane data group 700 and the vertex data 600 can be stored in a storage device included in an external device that can be accessed by the CPU 401 via the network 416. It is assumed that the plane data group 700 and the vertex data 600 are associated with each other.

Figure 8:
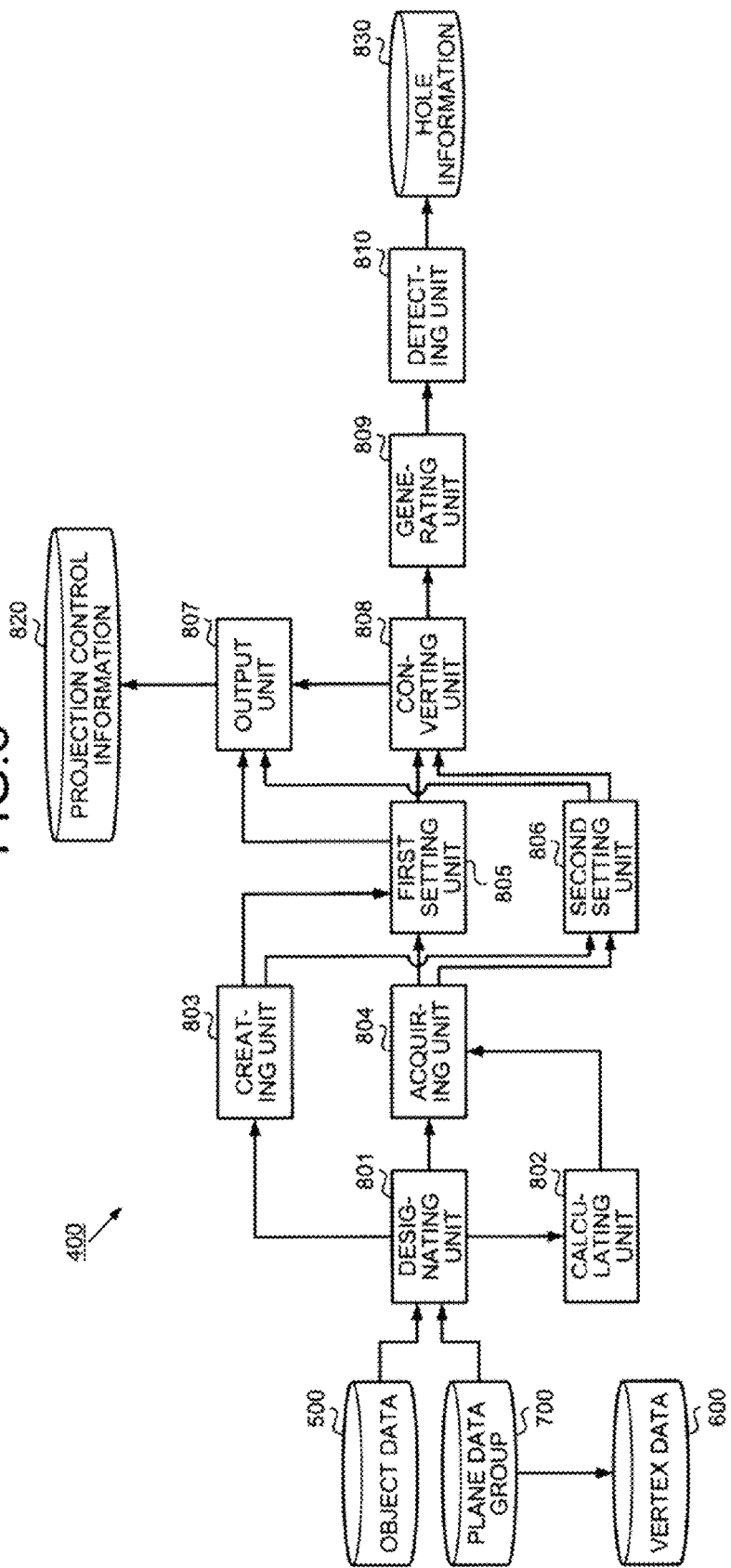
FIG. 8 is a block diagram depicting an example of a function of a data processing device 400.

FIG. 8 is a block diagram depicting an example of a function of a data processing device 400. The data processing device 400 has a designating unit 801, a calculating unit 802, and a creating unit 803. The data processing device 400 further has an acquiring unit 804, a first setting unit 805, a second setting unit 806, an output unit 807, a converting unit 808, a generating unit 809, and a detecting unit 810.

For example, a data processing program which includes coded processes to be performed by from the designating unit 801 to the detecting unit 810 is stored in the storage device such as the ROM 402, the RAM 403, the magnetic disk 405, or the optical disk 407 depicted in FIG. 4. For example, the CPU 401 reads the data processing program stored in the storage device and executes the coded processes, thereby realizing functions of from the designating unit 801 to the detecting unit 810.

The CPU 401 and the graphic board 412 can perform the processes of from the designating unit 801 to the detecting unit 810 by operating in conjunction with each other.

Detailed processes of from the designating unit 801 to the detecting unit 810 are dividedly described in first to third embodiments.

First Embodiment

There are cases where a hole of a part in a part group is hidden by another part other than a part group facing the part. In the first embodiment, a plane of a view volume is set from a plane of a part to a plane of another part not to include the other part, and the view volume including the part group is output to the projection unit. Therefore, when a through hole passes in a projection direction through any part of a part group to which the user performs projection or a clearance is formed by plural part data based on the view volume including the part group and the projection direction, the user creates a projection image based on the view volume and the projection direction by using the projection unit. Accordingly, the through hole or the clearance can be detected.

The designating unit 801 first designates one of the plane data from among the plane data group 700 related to the plural part data in the object data 500. For example, the user operates an input unit to cause the designating unit 801 to determine part data indicating a part as a projection subject in the object data 500. The designating unit 801 inputs designation of plane data related to the part data as the projection subject among the plane data group 700 to the data processing device 400. The input unit operated by the user can be the keyboard 410 or the mouse 411.

The designating unit 801 can designate plane data from among the plane data group 700 according to the designation input by the data processing device 400 via the input unit. Alternatively, the designating unit 801 can arbitrarily designate plane data from among the plane data group 700 or designate plane data in turn from the plane data group 700. In the first embodiment, the designating unit 801 designates the plane data f8 from among the plane data group 700. The plane data f8 designated by the designating unit 801 is referred to as designation plane data (hereinafter, "designation plane data f8" in the first embodiment). In the first embodiment, the plane F8 indicated by the designation plane data f8 is referred to as a designation plane F8.

Figure 9:
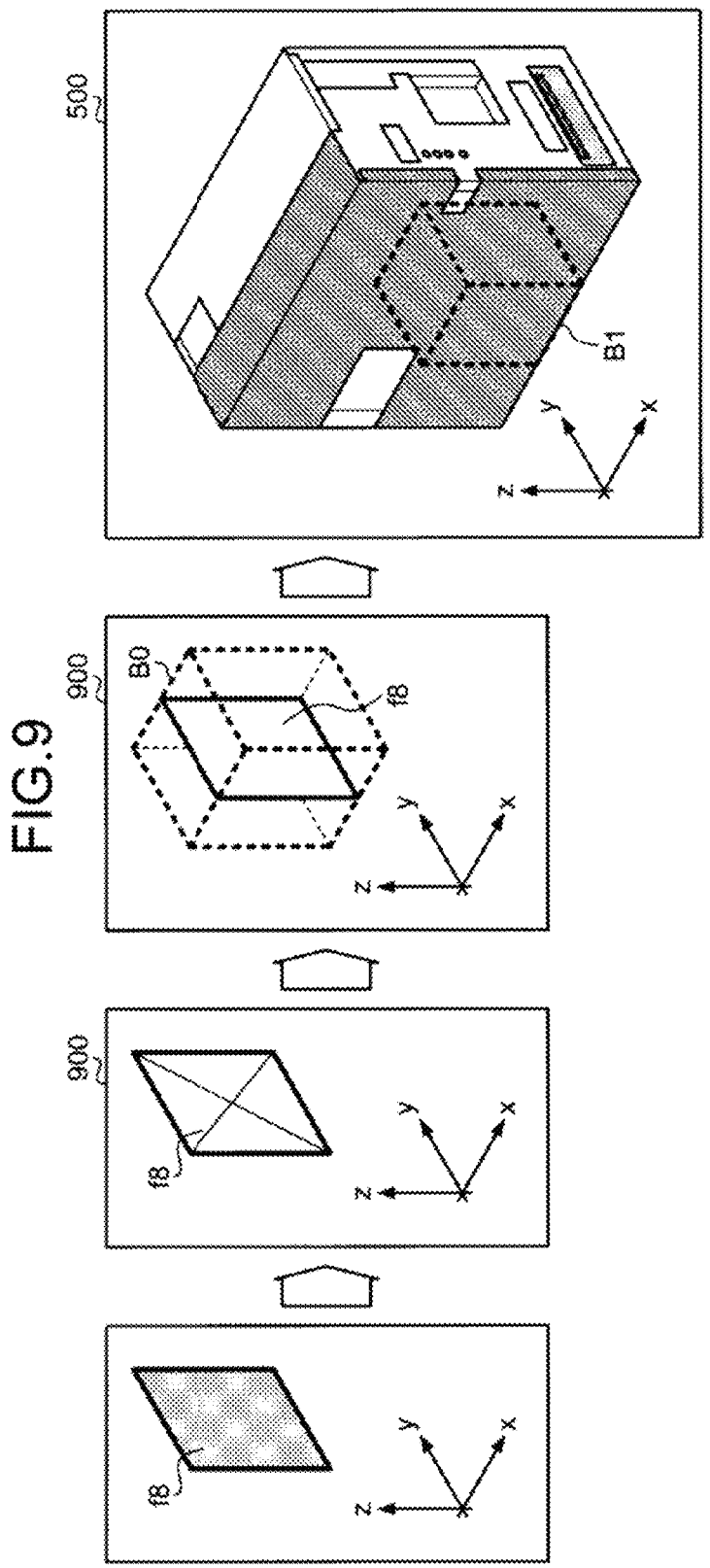
FIG. 9 is an explanatory diagram depicting an example of bounding boxes.

The creating unit 803 creates 3D CAD data related to the designation plane data f8. The creating unit 803 creates a smallest bounding box B0 that encloses the designation plane data f8 in the created 3D CAD data. The created bounding box B0 is a smallest cuboid that encloses the 3D CAD data related to the designation plane data f8 in the 3D orthogonal coordinate system. The creating unit 803 also creates an identical bounding box B1 to the created bounding box B0 in the object data 500. The created bounding box B1 becomes a view volume having a size set, which will be described later. An example of usage of the bounding box B0 is described in detail in the third embodiment. FIG. 9 depicts an example of the created bounding boxes B0 and B1.

FIG. 9 is an explanatory diagram depicting an example of the bounding boxes. For example, the creating unit 803 creates 3D CAD data 900 related to the designation plane data f8 in the same orthogonal coordinate system as the orthogonal coordinate system including the X axis, the Y axis, and the Z axis of the object data 500 by applying triangle polygons to the designation plane data f8, for example. The 3D CAD data 900 is part data.

The creating unit 803 creates the bounding box B0 that encloses assemblies from which the 3D CAD data related to the created designation plane data f8 is selected in the orthogonal coordinate system, for example. For example, any two plane data out of plane data of the bounding box B0 are parallel to the designation plane F8 and these two planes are rectangular planes that enclose the designation plane F8.

The creating unit 803 replicates the created bounding box B0, for example. The creating unit 803 places the replicated bounding box B1 in the object data 500 at the same position as that of the created bounding box B0, for example.

The 3D CAD data 900 related to the designation plane data f8 after creation of the bounding box B0 is stored in the storage device such as the ROM 402, the RAM 403, the magnetic disk 405, the optical disk 407, or the VRAM 414 depicted in FIG. 4. The object data 500 after creation of the bounding box B1 is stored in the storage device such as the ROM 402, the RAM 403, the magnetic disk 405, the optical disk 407, or the VRAM 414 depicted in FIG. 4.

For example, a Min point and a Max point of each of the bounding boxes B0 and B1 can be stored in the storage device. The Min point indicates a point having smallest X, Y, and Z coordinates among the vertices of the bounding box B0 or B1 in the orthogonal coordinate system including the X, Y, and Z axes. The Max point indicates a point having largest X, Y, and Z coordinates among the vertices of the bounding box B0 or B1 in the orthogonal coordinate system including the X, Y, and Z axes. For example, the bounding boxes B0 and B1 can be 3D data having shape data, color data, or coordinate data.

The calculating unit 802 calculates a normal vector of the designation plane data f8. In the first embodiment, the normal vector of the designation plane data f8 is a normal vector n1.

Figure 10:
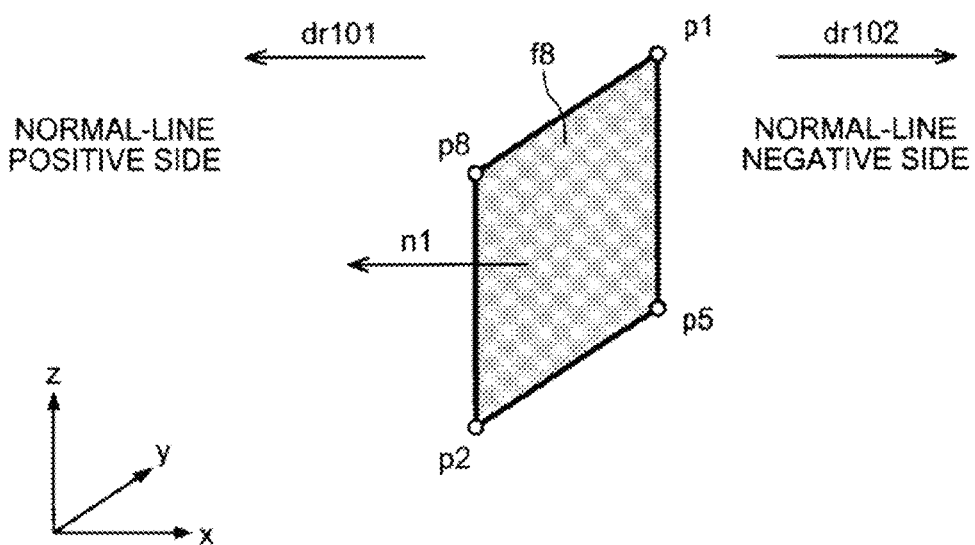
FIG. 10 is an explanatory diagram depicting an example of a normal vector n1.

FIG. 10 is an explanatory diagram depicting an example of the normal vector n1. For example, the calculating unit 802 calculates the normal vector n1 of the designation plane data f8 based on the following expression (1).

$$\text{Normal vector } n1 = (v8-v2) \times (v5-v2) \quad (1)$$

Reference character v8 denotes coordinates of the vertex p8, v2 denotes coordinates of the vertex p2, and v5 denotes coordinates of the vertex p5. Among the plane data group 700, plane data in a direction dr101 of the normal vector n1 of the designation plane data f8 is referred to as plane data on a normal-line positive side. Plane data in the opposite direction dr102 to the direction dr101 of the normal vector n1 of the designation plane data f8 among the plane data group 700 is referred to as plane data on a normal-line negative side.

The acquiring unit 804 acquires a first distance d121 in the direction dr101 of the normal vector n1 of the designation plane data f8 from the designation plane F8 to a first facing plane 1211 that faces the designation plane F8 in the plane data group 700. The first facing plane 1211 is the plane F6 in FIG. 7.

The acquiring unit 804 also acquires a second distance d122 in the opposite direction dr102 to the direction dr101 of the normal vector n1 of the designation plane data f8 from the designation plane F8 to a second facing plane 1212 that faces the designation plane F8 in the plane data group 700. The second facing plane 1212 faces the designation plane F8 on the opposite side of the designation plane F8 from the first facing plane 1211. The second facing plane 1212 is the plane F9 in FIG. 7.

For example, distances between facing planes among the plane data group 700 can be previously stored in a storage device and then the acquiring unit 804 can acquire the first distance between the designation plane F8 and the first facing plane 1212 from the storage device. The acquiring unit 804 can acquire the second distance between the designation plane F8 and the second facing plane 1212 from the storage device. Alternatively, the acquiring unit 804 can acquire the distance between the designation plane F8 and the first facing plane 1211 by calculating a difference between position data of the designation plane F9 and position data of the first facing plane 1211. For example, the acquiring unit 804 can acquire the distance between the designation plane F8 and the second facing plane 1212 by calculating a difference between the position data of the designation plane F8 and position data of the second facing plane 1212.

An example is depicted in which the first distance from the designation plane F8 to the first facing plane 1211 and the second distance from the designation plane F8 to the second facing plane 1212 are acquired based on lengths of sides of adjacent planes that are adjacent to the designation plane F8. For example, the acquiring unit 804 first specifies adjacent plane data indicating adjacent planes that are adjacent to the designation plane F8 indicated by the designation plane data f8, for example.

Figure 11:
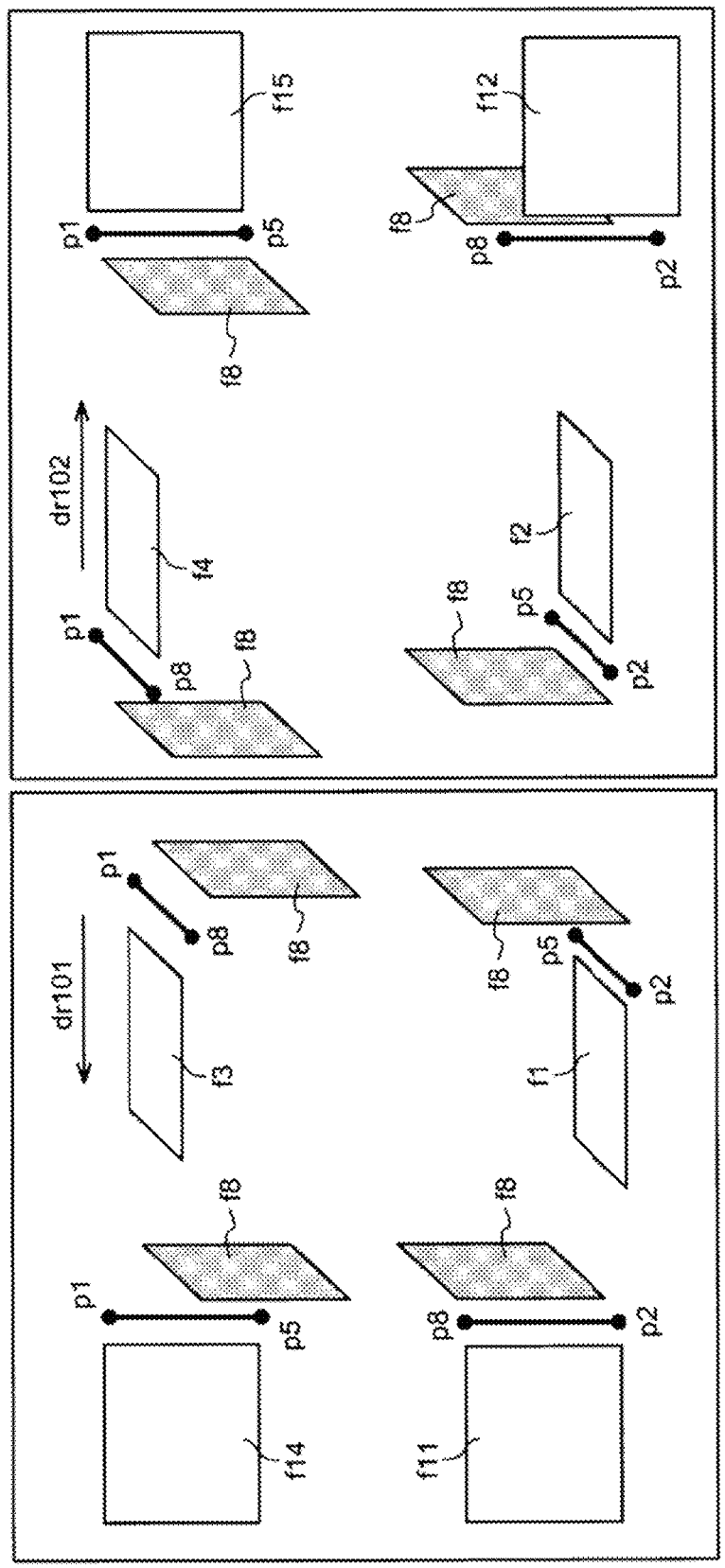
FIG. 11 is an explanatory diagram depicting an example of adjacent plane data.

FIG. 11 is an explanatory diagram depicting an example of the adjacent plane data. For example, the acquiring unit 804 determines whether data are adjacent plane data indicating an adjacent plane that is adjacent to the designation plane F8 indicated by the designation plane data f8, based on whether the corresponding plane has a side common to the designation plane F8. The adjacent planes adjacent to the designation plane F8 are planes F14, F11, F3, F1, F4, F2, F15, and F12.

The acquiring unit 804 specifies a first vertex that is not common to the designation plane data f8 among vertices of the adjacent plane data indicating the adjacent planes. The acquiring unit 804 specifies a second vertex that is not common to the adjacent plane data among the vertices of the designation plane data f8. The acquiring unit 804 calculates a vector w (xw, yw, zw) by subtracting coordinates (x2, y2, z2) of the second vertex from coordinates (x1, y1, z1) of the first vertex. The acquiring unit 804 calculates an inner product of the vector w and the normal vector n1.

The acquiring unit 804 determines whether the calculated inner product wn is equal to or larger than zero. When the inner product wn is equal to or larger than zero, the acquiring unit 804 determines that the adjacent plane data is on the normal-line positive side. When the inner product wn is smaller than zero, the adjacent plane data are on the normal-line negative side. The acquiring unit 804 performs determination on whether the adjacent plane data is on the normal-line positive side or the normal-line negative side with respect to all the adjacent plane data.

In the example depicted in FIG. 11, the plane data f14, f11, f3, and f1 are the adjacent plane data on the normal-line positive side among the adjacent plane data group. In the example depicted in FIG. 11, the plane data f4, f2, f15, and f12 are the adjacent plane data on the normal-line negative side among the adjacent plane data group.

Figure 12:
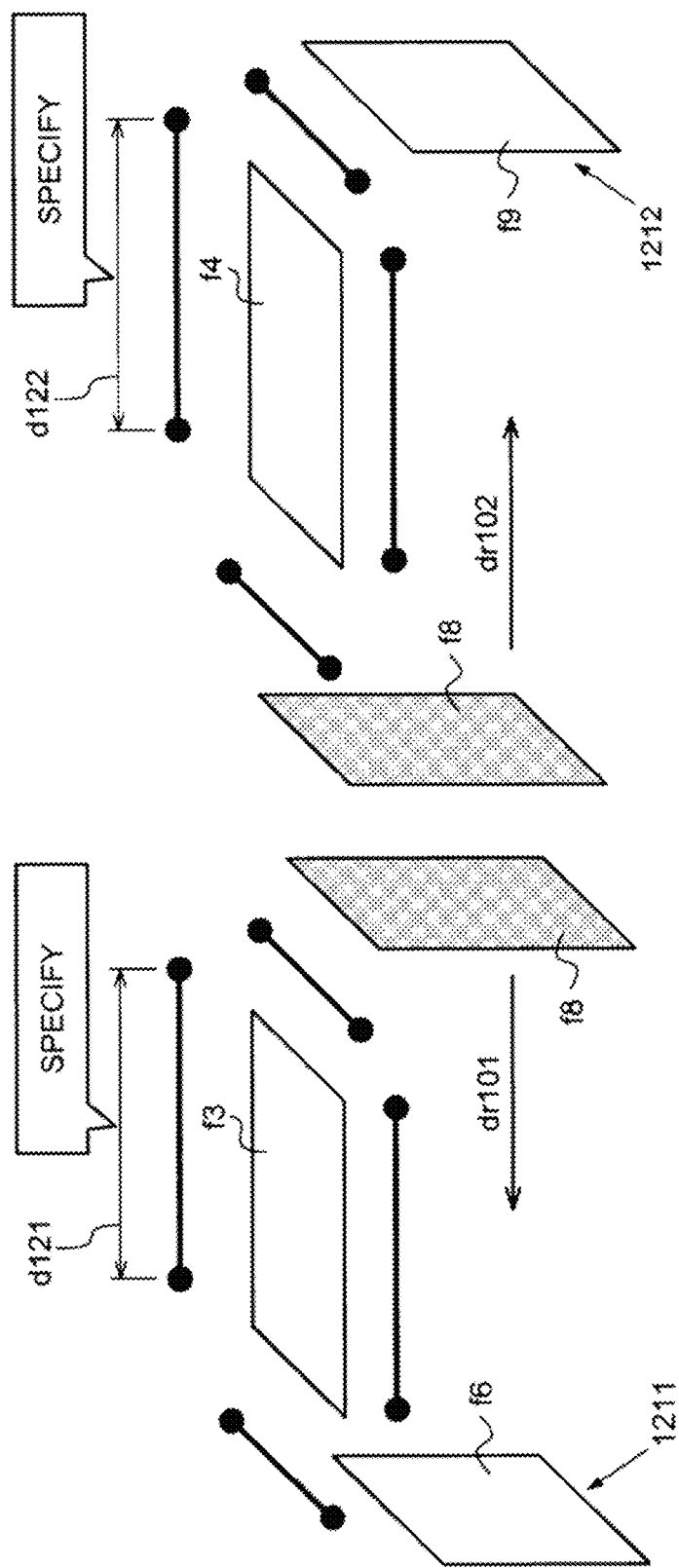
FIG. 12 is an explanatory diagram depicting an example of specification of first and second distances.

FIG. 12 is an explanatory diagram depicting an example of specification of the first and second distances. The acquiring unit 804 extracts length of sides parallel to the normal vector n1 from among sides of the adjacent plane indicated by the respective adjacent plane data on the normal-line positive side. For example, the acquiring unit 804 can calculate the lengths of the sides from differences between position data of the vertices constituting the designation plane data f8 and position data of vertices constituting the adjacent plane data. Alternatively, lengths of sides of a plane indicated by each plane data in the plane data group can be previously stored in the storage device to acquire the lengths from the storage device.

The acquiring unit 804 specifies a shortest one of the extracted lengths of the sides as the first distance d121. In FIG. 12, the sides parallel to the normal vector n1 among the sides of the adjacent planes indicated by the adjacent plane data on the normal-line positive side all have the same length. When the adjacent planes indicated by the adjacent plane data that are adjacent to the designation plane data f8 are not rectangular, the lengths of the sides in the same direction may be different. Accordingly, the acquiring unit 804 specifies the shortest one of the extracted lengths of the sides as the first distance d121. This enables the acquiring unit 804 to acquire the first distance d121 from the designation plane F8 indicated by the designation plane data f8 to the first facing plane 1211 that face the designation plane F8 at the shortest distance from the designation plane F8. In this case, the first facing plane 1211 is the plane F6. The specification result can be stored in the storage device such as the ROM 402, the RAM 403, the magnetic disk 405, or the optical disk 407.

The acquiring unit 804 extracts lengths of sides parallel to the normal vector n1 from among sides of the respective adjacent plane data on the normal-line negative side. The acquiring unit 804 specifies a shortest one of the extracted lengths of the sides as the second distance d122. In FIG. 12, the sides parallel to the normal vector n1 among the sides of the adjacent plane data on the normal-line negative side all have the same length. When the planes adjacent to the designation plane F8 are not rectangular, the lengths of the sides may be different. Accordingly, the acquiring unit 804 specifies the shortest one of the extracted lengths of the sides as the second distance d122.

This enables the acquiring unit 804 to acquire the second distance d122 from the designation plane F8 to the second facing plane 1212 that faces the designation plane F8 at the shortest distance from the designation plane data f8. In this way, the acquiring unit 804 can specify the length from the designation plane F8 to the second facing plane 1212 that is in the opposite direction dr102 to the direction dr101 of the normal vector n1 and at the shortest distance from the designation plane F8 among the facing planes that face the designation plane F8. In this case, the second facing plane 1211 is the plane F9. The specification result can be stored in the storage device such as the ROM 402, the RAM 403, the magnetic disk 405, or the optical disk 407.

Figure 13:
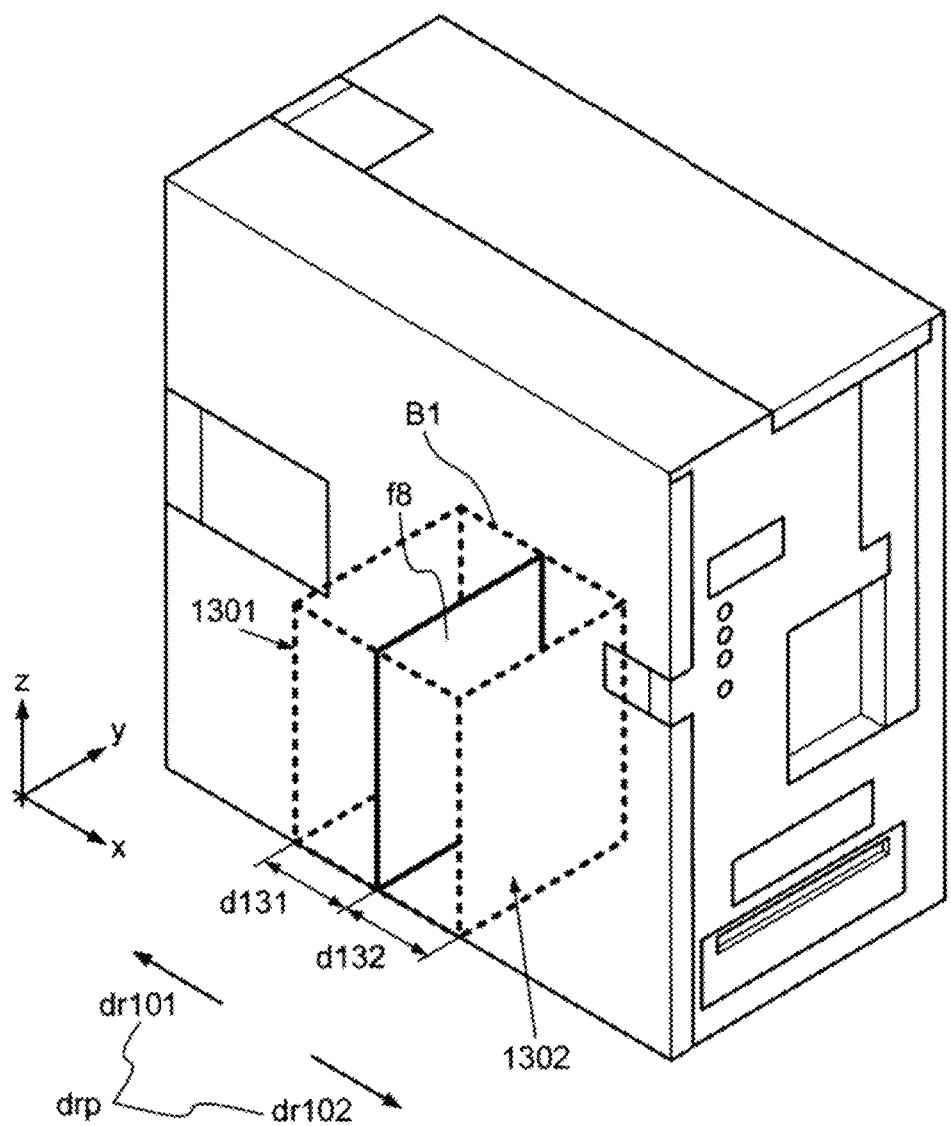
FIG. 13 is an explanatory diagram depicting an example of setting of first and second set planes according to a first embodiment.

FIG. 13 is an explanatory diagram depicting an example of setting of the first and second set planes according to the first embodiment. The first setting unit 805 sets at a position between the designation plane F8 and the first facing plane 1211 that is in the plane data group 700 and faces the designation plane F8, a first set plane 1301 that faces the designation plane F8 and the first facing plane 1211. In the example depicted in FIG. 13, the first set plane 1301 is a plane that is located in the direction dr101 of the normal vector n1 among planes parallel to the designation plane F8 among the plural planes of the bounding box B1. Therefore, the first setting unit 805 can change the size of the bounding box B1 by changing the value of the Min point or the Max point of the bounding box B1, for example.

For example, the first setting unit 805 can set the first set plane 1301 that faces the designation plane F8 and the first facing plane 1211 centrally between the designation plane F8 and the first facing plane 1211. For example, the first setting unit 805 sets the first set plane 1301 at a position corresponding to a half of the first distance from the designation plane F8 to the first facing plane 1211. Therefore, a distance d131 is a half of the first distance. This enables setting of a projection range not including parts indicated by part data corresponding to plane data that indicate the first facing plane 1211 or small parts connected to the parts.

Alternatively, the first setting unit 805 sets the first set plane 1301 at a distance, which is obtained by subtracting a predetermined distance from the first distance, away from the designation plane F8, for example. For example, the predetermined distance is previously set at an arbitrary value and is stored in the storage device such as the ROM 402, the ROM 403, the magnetic disk 405, or the optical disk 407. The predetermined distance can be a thickness of a thickest part among the parts in the object data 500. This enables setting of a projection range not including the parts indicated by the part data corresponding to the plane data that is indicated by the first facing plane 1211 or the small parts connected to the parts.

The second setting unit 806 sets at a position between the designation plane F8 and the second facing plane 1212 that is in the plane data group 700 and faces the designation plane F8, a second set plane 1302 that faces the designation plane F8 and the second facing plane 1212. In the example depicted in FIG. 13, the second set plane 1302 is a plane located in the opposite direction dr102 to the direction dr101 of the normal vector n1 among planes that are parallel to the designation plane F8 among the planes of the bounding box B1. For example, the second setting unit 806 can change the size of the bounding box B1 by changing the value of the Min point or the Max point of the bounding box B1, for example.

For example, the second setting unit 806 can set centrally between the designation plane F8 and the second facing plane 1212, the second set plane 1302 that faces the designation plane F8 and the second facing plane 1212. For example, the second setting unit 806 sets the second set plane 1302 at a position corresponding to a half of the second distance from the designation plane F8 to the second facing plane 1212. Therefore, a distance d132 is a half of the second distance. This enables setting of a projection range not including parts corresponding to the second facing plane 1212 or small parts connected to the parts.

Alternatively, the second setting unit 806 sets the second set plane 1302 at a distance, which is obtained by subtracting a predetermined distance from the second distance, away from the designation plane F8, for example. For example, the predetermined distance is previously set at an arbitrary value and is stored in the storage device such as the ROM 402, the RAM 403, the magnetic disk 405, or the optical disk 407. The predetermined distance can be the thickness of the thickest part among the parts indicated by the part data in the object data 500, for example. This enables setting of a projection range not including the parts indicated by the part data corresponding to the second facing plane 1212 or the small parts connected to the parts.

For example, the first setting unit 805 sets the set bounding box B1 to a view volume. In an orthogonal projection process according to an open graphics library (OpenGL) function, only information included in a space in the view volume among the object data 500 is projected. Therefore, the view volume becomes a projection range. The setting result can be stored in the storage device such as the ROM 402, the RAM 403, the magnetic disk 405, the optical disk 407, or the VRAM 414.

In FIG. 13, the projection direction drp is a direction from one of the first set plane 1301 and the second set plane 1302 toward the other set plane. For example, the direction dr102 is a direction from the first set plane 1301 toward the second set plane 1302 and the direction dr101 is a direction from the second set plane 1302 toward the first set plane 1301. There is no significant difference in projection images between when the projection direction drp is the direction dr101 and when the projection direction drp is the direction dr102, and thus the projection direction drp is not particularly limited.

A cuboid (the bounding box B1) starting from the first set plane 1301 set by the first setting unit 805 to the second set plane 1302 set by the second setting unit 806 is the view volume.

The output unit 807 outputs projection control information 820 related to a projection process for projecting a part group indicated by a part data group that is included in the bounding box B1 among the object data 500 in the projection direction drp, to the projection unit. An example of the projection unit is an API (Application Program Interface) with an orthogonal projection function of a 3D CAD tool having the OpenGL function. The 3D CAD tool can be the data processing device 400 or a device different from the data processing device 400.

It is assumed in the first embodiment the generating unit 809 of the data processing device 400 has the API with the orthogonal projection function according to the OpenGL. The output unit 807 can output the information to an orthogonal projection unit after a conversion process by the converting unit 808, which will be described later.

The converting unit 808 converts color data of all the part data among the object data 500 into specific color data (first color data). The converting unit 808 also converts background portions among the object data 500 into color data (second color data) different from the specific color data (first color data). For example, the converting unit 808 can convert all the color data of the parts among the object data 500 into white, and the converting unit 808 can convert all the color data of the background portions among the object data 500 into black.

For example, the generating unit 809 orthogonally projects a part group included between the first set plane 1301 and the second set plane 1302 among the object data 500 converted by the converting unit 808, using the OpenGL orthogonal projection function in the projection direction drp. In this way, the generating unit 809 generates an orthogonal projection image related to the part group.

Figure 14:
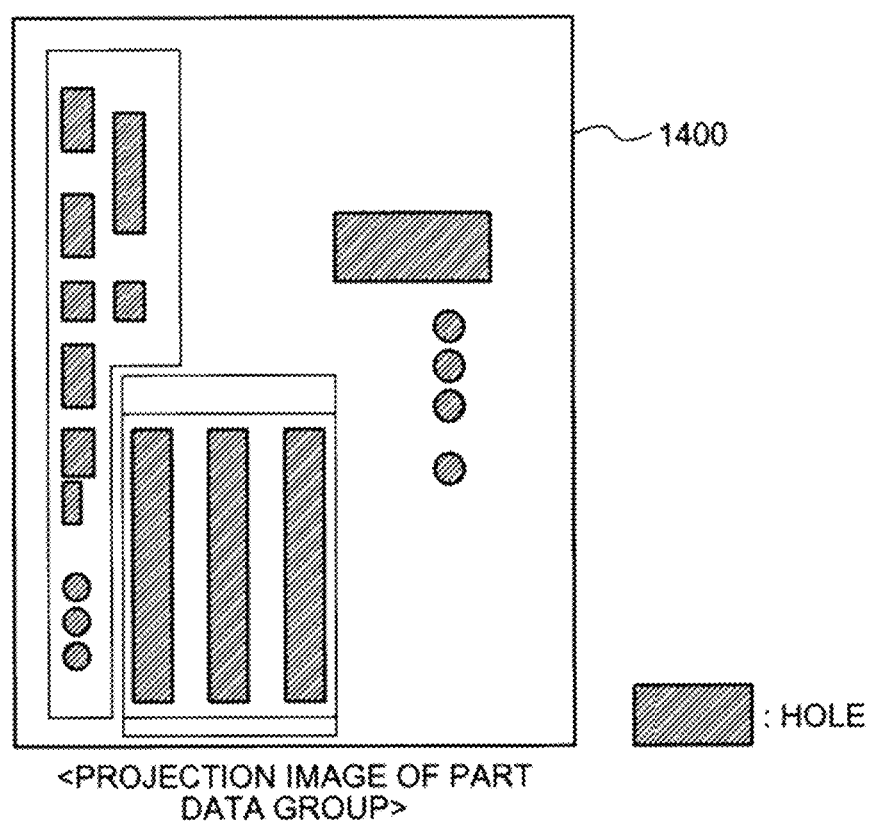
FIG. 14 is an explanatory diagram depicting an example of a projection image related to a part group.

FIG. 14 is an explanatory diagram depicting an example of a projection image related to a part group. A projection image 1400 is related to a part group and generated by the generating unit 809. The projection image 1400 is stored in the storage device such as the ROM 402, the RAM 403, the magnetic disk 405, the optical disk 407, or the VRAM 414 depicted in FIG. 4.

The detecting unit 810 detects hole information 830 from the projection image 1400 generated by the generating unit 809. The hole information 830 includes the area (mm.sup.2) of a hole, the shape of the hole, the perimeter (mm) of the hole, the circularity degree of the hole, the gravity center of the hole, and the like, as mentioned above. For example, the area or the shape is used as the hole information 830 as an acoustic analysis parameter. The shape is detected by classifying the hole into a round shape or a quadrangular shape, for example. The detecting unit 810 can detect the hole information 830 by performing contour tracing.

The hole information 830 can be used as a fluid analysis parameter as well as the acoustic analysis parameter. The hole information 830 is stored in the storage device such as the ROM 402, the RAM 403, the magnetic disk 405, the optical disk 407, or the VRAM 414 depicted in FIG. 4.

According to the first embodiment, setting accuracy of the projection range can be enhanced. Furthermore, the calculation amount can be reduced in the first embodiment by determining the projection range using the plane data that indicate planes obtained by abstracting the 3D object data.

Second Embodiment

In a second embodiment of the present invention, even when the part data corresponding to the designation plane data are part data at an edge in the object data, a projection range including the parts corresponding to the designation plane data or parts connected to the parts is set. This enhances setting accuracy of the projection range. Because processes of from the designating unit 801 to the creating unit 803 in the second embodiment are the same as those in the first embodiment, detailed explanations thereof will be omitted.

In the second embodiment, a cuboid as a view volume is a bounding box B2. The bounding box B2 is created in the same method as the creation method of the bounding box B1 as described in the first embodiment. A normal vector of a designation plane in the second embodiment is a normal vector n2.

A first set plane is a plane located in a direction of the normal vector n2 out of planes parallel to a designation plane indicated by designation plane data among plural plane data of the bounding box B2. A second set plane is a plane located in the opposite direction to the direction of the normal vector n2 out of the planes parallel to the designation plane indicated by the designation plane data among the plural plane data of the bounding box B2.

The acquiring unit 804 cannot acquire the first distance, for example, when there is no first facing plane that faces the designation plane in the direction of the normal vector n2 from the designation plane data among the plane data group 700.

When the first distance cannot be specified by the acquiring unit 804, the first setting unit 805 sets the first set plane with a space away from the designation plane, which is equal to a space between the second set plane and the designation plane. For example, when the second setting unit 806 sets the second set plane at a position corresponding to a half of the second distance from the designation plane, the first setting unit 805 can set the first set plane at a position corresponding to a half of the second distance from the designation plane. That is, the first setting unit 805 performs setting to match a space between the first set plane and the designation plane to that between the second set plane and the designation plane.

The first setting unit 805 can set the first set plane at a predetermined distance from the designation plane. The predetermined distance is previously set at an arbitrary value and stored in the storage device such as the ROM 402, the RAM 403, the magnetic disk 405, or the optical disk 407. In this way, even when there is no first facing plane, the first set plane is set, thereby increasing likelihood that parts indicated by part data corresponding to the designation plane and other parts connected to the parts are included in a projection range.

The acquiring unit 804 cannot acquire the second distance when there is no second facing plane that faces the designation plane in the opposite direction to the direction of the normal vector n2 from the designation plane data in the plane data group 700.

When the acquiring unit 804 cannot specify the second distance, the second setting unit 806 sets the second set plane with the same space away from the designation plane as that between the first set plane and the designation plane. For example, when the first setting unit 805 sets the first set plane at a position corresponding to a half of the first distance from the designation plane, the second setting unit 806 can set the second set plane at a position corresponding to a half the first distance from the designation plane. That is, the second setting unit 806 performs setting to match a space between the second set plane and the designation plane to that between the first set plane and the designation plane.

Alternatively, the second setting unit 806 sets the second set plane at a predetermined distance from the designation plane. For example, the predetermined distance is previously set at an arbitrary value and is stored in the storage device such as the ROM 402, the RAM 403, the magnetic disk 405, or the optical disk 407. Accordingly, even when there is no second facing plane, likelihood that the parts indicated by the part data corresponding to the designation plane data and other parts connected to the parts are included in a projection range is increased by setting the second set plane.

The output unit 807 sets the set bounding box B2 to a view volume. The generating unit 809 generates an orthogonal projection image by orthogonally projecting a part group included in the view volume among the object data 500 in a direction from the first set plane to the second set plane or in a direction from the second set plane to the first set plane.

For example, an example where the designation plane data is the plane data f10 is described. In the second embodiment, the plane data f10 is hereinafter referred to as the designation plane data f10. Adjacent plane data adjacent to the designation plane F10 are the plane data f5, f13, f4, f16, and f9. It is assumed in this case that the plane data f5, f13, f4, f16, and f9 are adjacent plane data on the normal-line positive side. For example, the acquiring unit 804 extracts sides in the direction of the normal vector n2 of the respective adjacent plane data on the normal-line positive side. In this case, a side between the vertices p9 and p8 of the plane data f4 and a side between the vertices p12 and p11 of the plane data f4 have a shortest length. Accordingly, the acquiring unit 804 acquires the length of the side between the vertices p9 and p8 and the length of the side between the vertices p12 and p11 as the first distance.

Although not being a distance from the designation plane F10 to the plane F7 that faces the designation plane F10, the acquired first distance is shorter than the distance from the designation plane F10 to the plane F7. Therefore, when the first setting unit 805 sets the first set plane between the designation plane F10 and the plane F7, a distance from the designation plane F10 to the first set plane becomes shorter than that from the designation plane F10 to the plane F7. Accordingly, parts related to the plane data f7 are not included in the bounding box B2. On the other hand, the acquiring unit 804 cannot specify the second distance because there is no adjacent plane data on the normal-line negative side.

Figure 15:
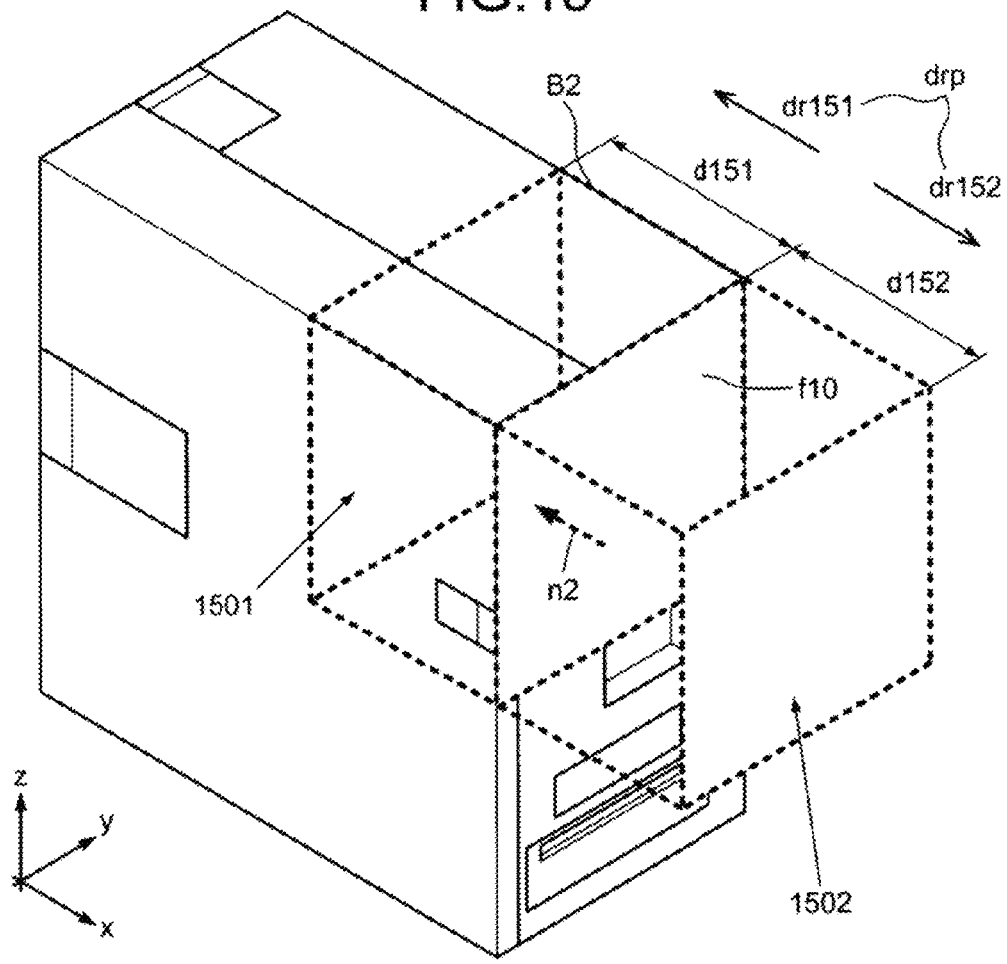
FIG. 15 is an explanatory diagram depicting an example of setting of the first and second set planes according to a second embodiment.

FIG. 15 is an explanatory diagram depicting an example of setting of the first and second set planes according to the second embodiment. In FIG. 15, the first setting unit 805 sets a first set plane 1501 in a direction dr151 of the normal vector n2 at a distance d151 from the designation plane F10. The distance d151 is a half of the first distance, for example. In FIG. 15, the second setting unit 806 sets a second set plane 1502 in the opposite direction dr152 to the normal vector n2 at a distance d152 from the designation plane F10. The distance d152 is a half the first distance, for example. Alternatively, the distance d152 is a predetermined distance. Therefore, when parts indicated by part data corresponding to designation plane data are parts at an edge in the object data 500, the second set plane 1502 is set in a space where the object data 500 are not located. The bounding box B2 becomes a view volume. In FIG. 15, the projection direction drp is one of the directions dr151 and dr152.

According to the second embodiment, even when there is no facing plane that faces a designation plane and thicknesses of parts indicated by part data corresponding to the designation plane data and parts connected to the indicated parts are unknown, these parts can be included in a projection range as much as possible.

Third Embodiment

When the orthogonal projection is performed in the 3D CAD tool, a designation plane needs to be rectangular. In a third embodiment of the present invention, when a designation plane is not rectangular, a third projection image is generated by combining a first projection image that is obtained by projecting a part group included between the first set plane and the second set plane and a second projection image that is obtained by projecting the designation plane, in the object data 500. Accordingly, the projection image can be generated regardless of shapes of parts or planes.

Figure 16:
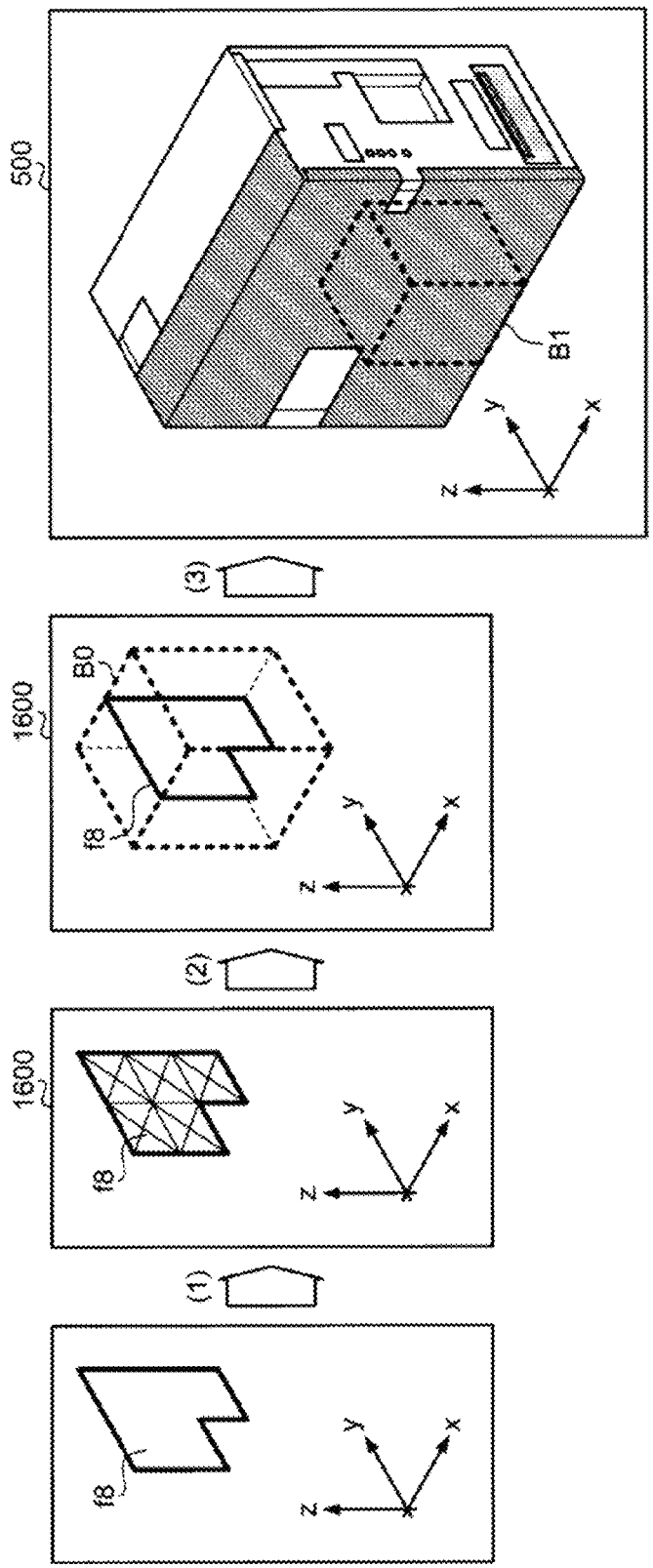
FIG. 16 is an explanatory diagram depicting an example in which a plane is not rectangular.

FIG. 16 is an explanatory diagram depicting an example in which a plane is not rectangular. FIG. 16 depicts an example in which the designation plane F8 is not rectangular. The creating unit 803 creates 3D CAD data 1600 related to the designation plane data f8. The creating unit 803 creates a bounding box B0 of the created 3D CAD data 1600 related to the designation plane data f8. The bounding box B0 is a cuboid even when the designation plane F8 is not rectangular, and thus planes parallel to the designation plane F8 among planes of the bounding box B0 are rectangular. Therefore, the bounding box B0 created in the third embodiment and the bounding box B0 described in the first embodiment are the same.

The creating unit 803 further creates a bounding box B1 identical to the created bounding box B0 in the object data 500. The bounding box B0 is a view volume to be set in the 3D CAD data 1600, and the bounding box B1 is a view volume to be set in the object data 500. A process performed by the acquiring unit 804 is the same as that described in the first embodiment and thus detailed explanations thereof will be omitted.

FIG. 17 is an explanatory diagram depicting an example of setting of the first set plane and the second set plane according to the third embodiment. Process performed by the first setting unit 805 and the second setting unit 806 to set the first set plane 1301 and the second set plane 1302 in the object data 500 are the same as that described in the first embodiment and thus detailed explanations thereof will be omitted.

The first setting unit 805 sets a first set plane 1701 parallel to the designation plane F8 in the direction of the normal vector n1 among plane data of the bounding box B0. The second setting unit 806 sets a second set plane 1702 parallel to the designation plane F8 in the direction of the normal vector n1 among the plane data of the bounding box B0. While the bounding box B0 and the bounding box B1 are set at the same size by the first setting unit 805 and the second setting unit 806 in FIG. 17, these bounding boxes does not necessarily have the same size. It is only necessary that the designation plane F8 can be projected and thus the sizes of the bounding boxes are not particularly limited as far as the designation plane data f8 can be projected.

For example, the first setting unit 805 sets the bounding boxes B0 and B1 set by the first setting unit 805 as view volumes of the object data 500 and the 3D CAD data 1600, respectively.

The converting unit 808 converts color data of parts in the object data 500 into specific color data (first color data). The converting unit 808 converts background information other than the parts in the object data 500 into color data (second color data) different from the specific color data.

The converting unit 808 converts color data of the designation plane data f8 in the 3D CAD data 1600 into specific color data. The converting unit 808 converts color data of the second set plane 1702 in the 3D CAD data 1600 into color data (third color data) different from the specific color data. Alternatively, the converting unit 808 converts color data of data other than the designation plane data f8 in the 3D CAD data 1600 into the third color data, for example.

The generating unit 809 generates a first projection image identical to the projection image 1400 as described in the first embodiment. The generating unit 809 also generates a second projection image related to the designation plane data f8 by orthogonally projecting the 3D CAD data 1600 in a perpendicular direction to the designation plane data f8 with regarding the bounding box B1 as a view volume.

Figure 18:
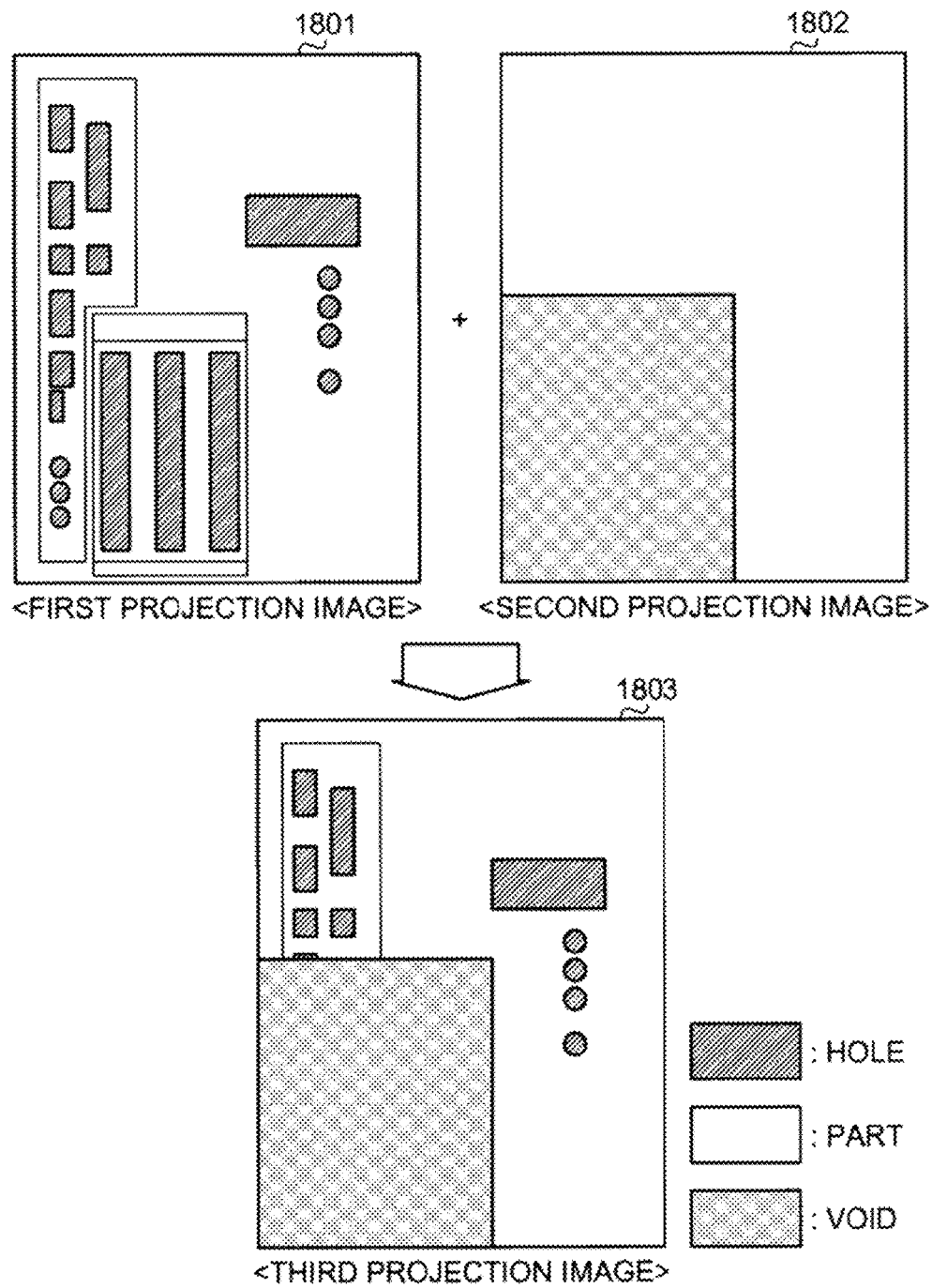
FIG. 18 is an explanatory diagram depicting an example of two generated projection images.

FIG. 18 is an explanatory diagram depicting an example of two generated projection images. A first projection image 1801 and a second projection image 1802 have the same size. The generating unit 809 synthesizes color data of the first projection image 1801 and color data of the second projection image 1802 to generate a third projection image 1803. In FIG. 18, "+" denotes synthesis. For example, the generating unit 908 selects same pixels in the first projection image 1801 and the second projection image 1802 in turn.

For example, each time a pixel is selected, the generating unit 809 acquires color data of the selected pixel from the second projection image 1802. The generating unit 809 determines whether the acquired color data is the first color data, for example. When the acquired color data is not the first color data, the generating unit 809 converts color data of the corresponding pixel in the first projection image 1801 to the selected pixel into third color data, for example.

In this way, the generating unit 809 generates the third projection image 1803 including the first projection image 1801 and the second projection image 1802 synthesized. The third projection image 1803 is stored in the storage device such as the ROM 402, the RAM 403, the magnetic disk 405, the optical disk 407, or the VRAM 414. The detecting unit 810 detects the hole information 830 from portions of the second color data in the third projection image 1803 generated by the generating unit 809. Because portions of the third color data in the third projection image 1803 are not related to a part group, the detecting unit 810 recognizes the portions of the third color data as portions where there is nothing.

According to the third embodiment, even when the shape of the designation plane is not rectangular, hole information in parts corresponding to the designation plane data can be detected by generating a projection image according to the shape of the designation plane.

Figure 19:
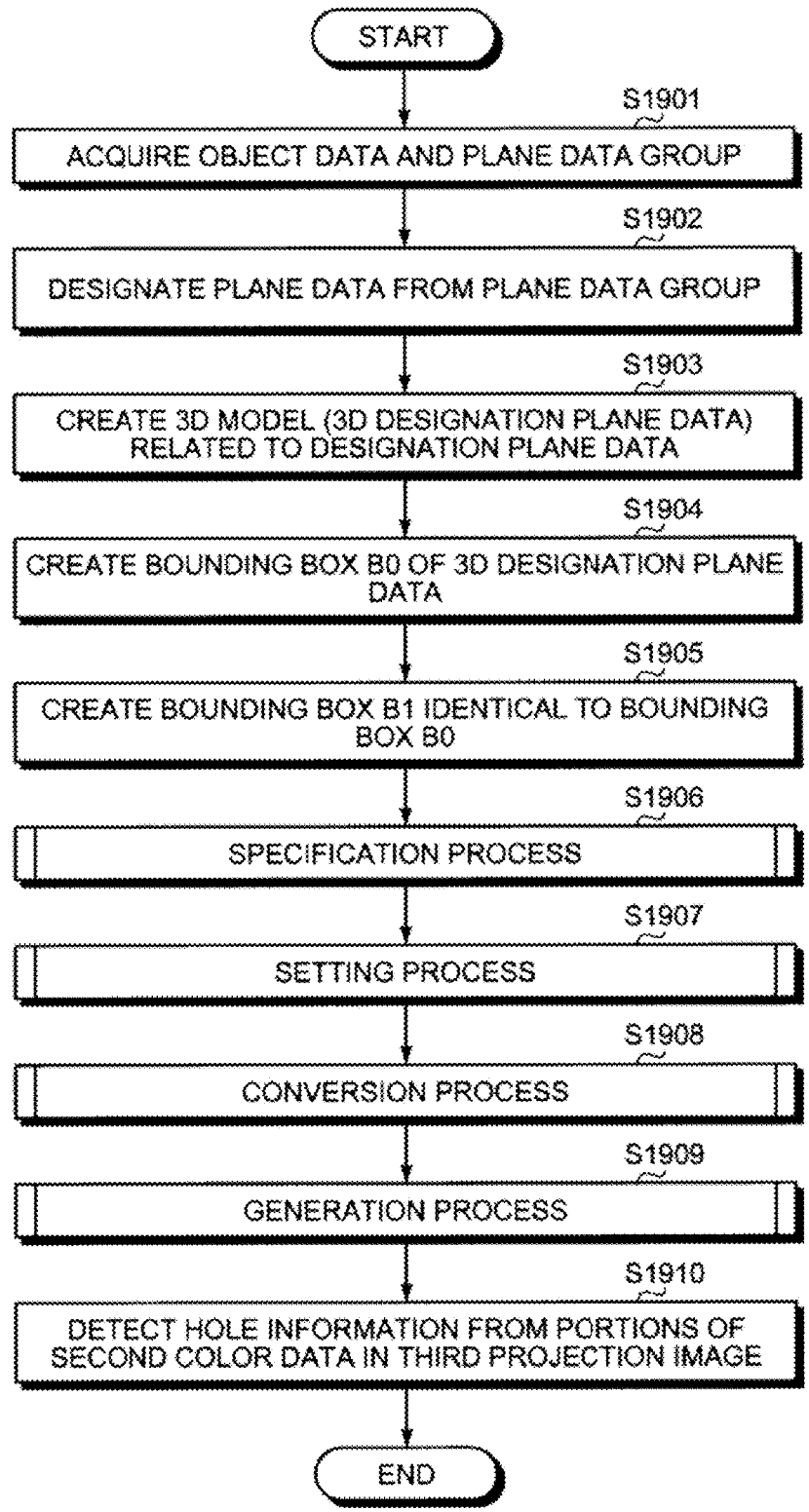
FIG. 19 is a flowchart depicting an example of a data processing procedure performed by the data processing device 400.

FIG. 19 is a flowchart depicting an example of a data processing procedure performed by the data processing device 400. Here, a data processing procedure performed by the data processing device 400 including the function described in the first to third embodiments is described. The data processing device 400 acquires the object data 500 and the plane data group 700 from the storage device (step S1901). The data processing device 400 designates one of the plane data from the plane data group 700 via the designating unit 801 (step S1902). The designated plane data is referred to as designation plane data.

The data processing device 400 creates a 3D model (3D designation plane data) related to the designation plane data (step S1903) and creates a bounding box B0 of the 3D designation plane data, via the creating unit 803 (step S1904). The 3D designation plane data is information including the designation plane data transformed into three dimensions. The 3D designation plane data is the 3D CAD data 900 or the 3D CAD data 1600 mentioned above, for example. The 3D designation plane data can be acquired by the data processing device 400 from 3D designation plane data previously created by the user and stored in the storage device.

The data processing device 400 creates a bounding box B1 identical to the bounding box B0 in the object data 500 via the creating unit 803 (step S1905). The data processing device 400 executes the specification process via the acquiring unit 804 (step S1906) and executes the setting process via the first setting unit 805 and the second setting unit 806 (step S1907).

The data processing device 400 executes the conversion process via the converting unit 808 (step S1908) and executes the generation process via the generating unit 809 (step S1909). The data processing device 400 detects hole information from portions of the second color data in the third projection image via the detecting unit 810 (S1910).

Figure 20:
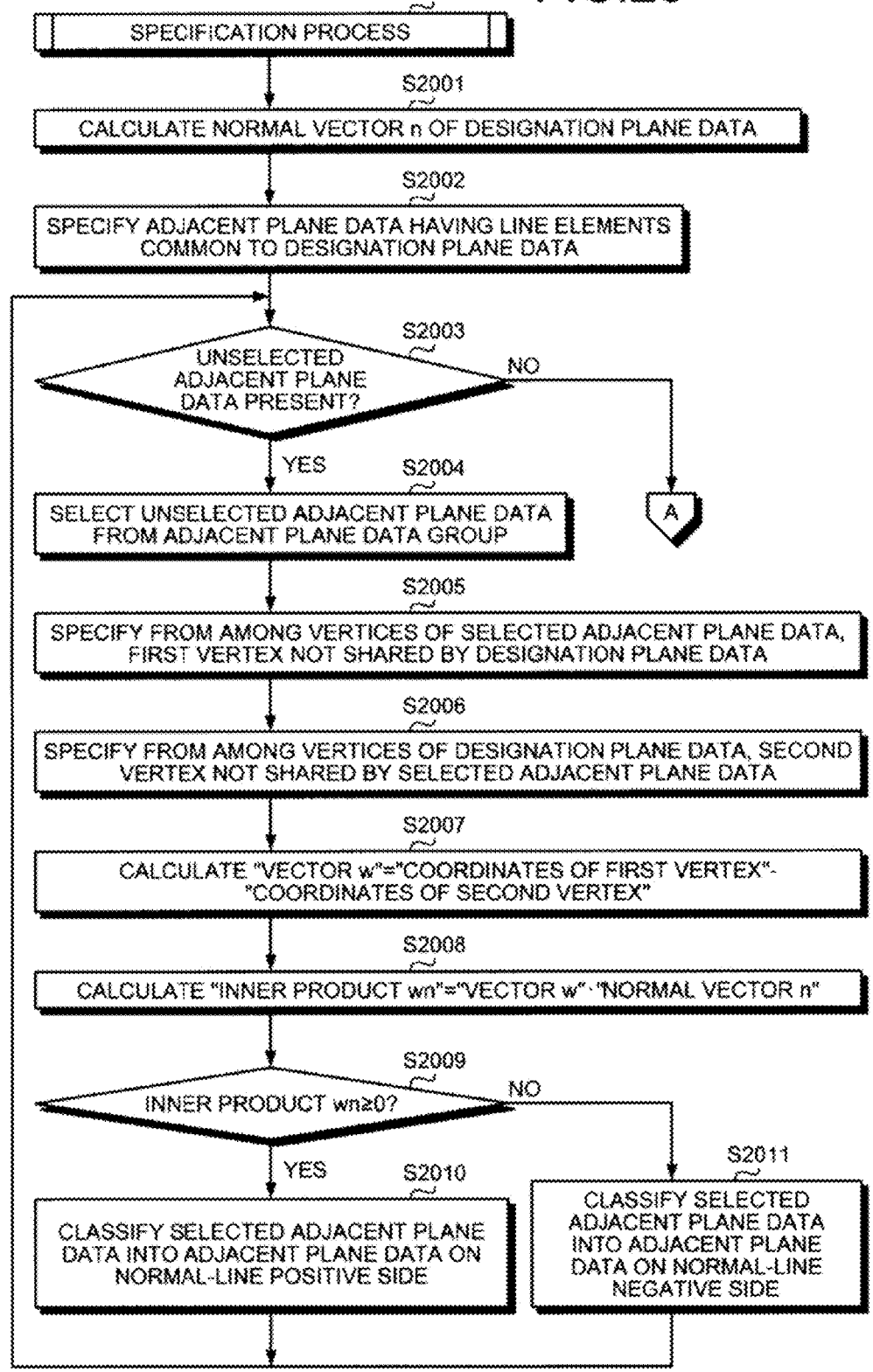

FIGS. 20 and 21 are flowcharts depicting detailed explanations of the specification process (step S1906) in FIG. 19. The data processing device 400 calculates a normal vector n of the designation plane (step S2001) and specifies adjacent plane data having line elements common to the designation plane data (step S2002). The data processing device 400 determines whether there is unselected adjacent plane data (step S2003).

Upon determining that there is unselected adjacent plane data (step S2003: YES), the data processing device 400 selects the unselected adjacent plane data from the adjacent plane data group (step S2004). The data processing device 400 specifies a first vertex not shared by the designation plane data from among vertices of the selected adjacent plane data (step S2005). The data processing device 400 specifies a second vertex not shared by the selected adjacent plane data from among vertices of the designation plane data (step S2006).

The data processing device 400 calculates "vector w"="coordinates of the first vertex"−"coordinates of the second vertex" (step S2007) and calculates "inner product wn"="vector w"·"the normal vector n" (step S2008). The data processing device 400 determines whether the inner product wn≥0 (step S209). Upon determining that the inner product wn≥0 (step S2009: YES), the data processing device 400 classifies the selected adjacent plane data into adjacent plane data on the normal-line positive side (step S2010) and returns to step S2003.

Upon determining that the inner wn≥0 does not hold true (step S2009: NO), the data processing device 400 classifies the selected adjacent plane data into adjacent plane data on the normal-line negative side (step S2011) and returns to step S2003.

Upon determining at step S2003 that there is no unselected adjacent plane data (step S2003: NO), the data processing device 400 determines whether there is adjacent plane data on the normal-line positive side (step S2012).

Upon determining that there is no adjacent plane data on the normal-line positive side (S2012: NO), the data processing device 400 proceeds to step S2016. Upon determining that there is adjacent plane data on the normal-line positive side (step S2012: YES), the data processing device 400 extracts sides in the direction of the normal vector n from among sides of the adjacent plane data on the normal-line positive side (step S2013).

The data processing device 400 specifies a length of each of the extracted sides (step S2014) and specifies the shortest length of the extracted sides as a first distance (step S2015). The data processing device 400 determines whether there is adjacent plane data on the normal-line negative side (step S2016). Upon determining that there is no adjacent plane data on the normal-line negative side (step S2016: NO), the data processing device 400 proceeds to step S1907.

Upon determining that there is adjacent plane data on the normal-line negative side (step S2016: YES), the data processing device 400 extracts sides in the direction opposite to that of the normal vector n from among sides of adjacent planes indicated by the adjacent plane data on the normal-line negative side (step S2017). The data processing device 400 specifies the length of each of the extracted sides (step S2018), specifies the shortest length of the extracted sides as a second distance (step S2019), and proceeds to step S1907.

FIG. 22 is a flowchart depicting detailed explanations of the setting process (step S1907) depicted in FIG. 19. The data processing device 400 first determines whether the first distance is specified (step S2201). Upon determining that the first distance is specified (step S2201: YES), the data processing device 400 proceeds to step S2202. The data processing device 400 sets a first set plane that is parallel to the designation plane in the direction of the normal vector n among planes of the bounding box B0 (step S2202). It suffices the bounding box B0 has a size that enables projection of the designation plane and thus it suffices the first set plane and the designation plane do not overlap with each other. Accordingly, a set position of the first set plane is not particularly limited.

The data processing device 400 sets the first set plane that is parallel to the designation plane in the direction of the normal vector n among planes of the bounding box B1 in the middle of the first facing plane and the designation plane (step S2203). For example, the data processing device 400 sets the first set plane at substantially a half of the first distance from the designation plane, for example.

Upon determining that no first distance is specified (step S2201: NO), the data processing device 400 proceeds to step S2204. The data processing device 400 sets a first set plane that is parallel to the designation plane in the direction of the normal vector n among the planes of the bounding box B0 (step S2204). As mentioned above, because it suffices the bounding box B0 has the size that enables projection of the designation plane, it suffices the first set plane and the designation plane do not overlap with each other and thus a set position of the first set plane is not particularly limited.

The data processing device 400 sets a first set plane that is parallel to the designation plane in the direction of the normal vector n among the planes of the bounding box B1 (step S2205). For example, the data processing device 400 sets the first set plane at a half of the second distance from the designation plane, for example. Accordingly, a space between the first set plane and the designation plane is matched to a space between the second set plane and the designation plane. Alternatively, the data processing device 400 for example sets the first set plane at a predetermined distance, which is stored in the storage device, from the designation plane.

After step S2203 or S2205, the data processing device 400 determines whether the second distance is specified (step S2206). Upon determining that the second distance is specified (step S2206: YES), the data processing device 400 proceeds to step S2207. The data processing device 400 sets a second set plane that is parallel to the designation plane in the direction opposite to that of the normal vector n among the planes of the bounding box B0 (step S2207). As described above, because it suffices the bounding box B0 has a size that enables projection of the designation plane, it suffices the second set plane and the designation plane do not overlap with each other and thus a set position of the second set plane is not particularly limited.

The data processing device 400 sets a second set plane that is parallel to the designation plane in the direction opposite to that of the normal vector n among the planes of the bounding box B1 in the middle of the second facing plane and the designation plane (step S2208). For example, the data processing device 400 sets the second set plane at a half of the second distance from the designation plane, for example. The data processing device 400 proceeds to step S2211 after step S2208.

Upon determining that no second distance is specified (step S2206: NO), the data processing device 400 proceeds to step S2209. The data processing device 400 sets a second set plane parallel to the designation plane in the direction opposite to that of the normal vector n among the planes of the bounding box B0 (step S2209). As described above, because it suffices the bounding box B0 has a size that enables projection of the designation plane, it suffices the second set plane and the designation plane data do not overlap with each other and thus a set position of the second set plane is not particularly limited.

The data processing device 400 sets the second set plane parallel to the designation plane in the direction opposite to that of the normal vector n among the planes of the bounding box B1 at a distance shorter than the first distance or a predetermined distance from the designation plane (step S2210). For example, the data processing device 400 sets the second set plane at a half of the first distance from the designation plane data, for example. This matches a space between the first set plane and the designation plane to that between the second set plane and the designation plane. Alternatively, the data processing device 400 for example sets the second set plane at a predetermined distance, which is stored in the storage device, from the designation plane.

After step S2208 or S2210, the data processing device 400 sets the bounding boxes B0 and B1 as view volumes of orthogonal projection (step S2211). The data processing device 400 outputs projection control information including the set result of the view volumes and a projection direction of either a direction from the first set plane toward the second set plane or a direction from the second set plane toward the first set plane (step S2212). The data processing device 400 proceeds to step S1908. An output destination of the projection control information is the orthogonal projection unit mentioned above.

In the flowchart of the setting process (S1907), either the steps of setting the first set plane (S2202 to S2205) or the steps of setting the second set plane (S2207 to S2210) can be executed first.

FIG. 23 is a flowchart depicting detailed explanations of the conversion process (step S1908) depicted in FIG. 19. The data processing device 400 converts color data of the parts in the object data 500 into first color data (step S2301) and converts color data of background information in the object data 500 into second color data (step S2302).

The data processing device 400 converts color data of designation plane data in the 3D designation plane data into first color data (step S2303), converts color data of background information in the 3D designation plane data into third color data (step S2304), and proceeds to step S1909.

FIG. 24 is a flowchart depicting detailed explanations of the generation process (step S1909) depicted in FIG. 19. The data processing device 400 generates a first projection image by orthogonally projecting the part group included in the bounding box B1 among the object data 500 in the projection direction drp (step S2401). In this case, the projection direction drp is the direction from the first set plane toward the second set plane or the direction from the second set plane toward the first set plane. The data processing device 400 generates a second projection image by orthogonally projecting parts included in the bounding box B0 among the 3D designation plane data in the projection direction drp (step S2402). The parts included in the bounding box B0 correspond to the designation plane transformed into three dimensions. The projection direction drp is a direction from one of the first set plane and the second set plane toward the other set plane.

The data processing device 400 outputs the first projection image and the second projection image via the output unit 807 (step S2403) and sets i=0 (step S2404). The data processing device 400 determines whether an expression: i<the number of pixels in the first projection image holds true (step S2405).

Upon determining that the expression: i<the number of pixels in the first projection image does not hold true (step S2405: NO), the data processing device 400 acquires color data of an i-th pixel in the second projection image (step S2406). The data processing device 400 determines whether color data of the i-th pixel in the second projection image is the third color data (step S2407).

Upon determining that the color data of the i-th pixel in the second projection image is the third color data (step S2407: YES), the data processing device 400 sets color data of an i-th pixel in the first projection image as the third color data (step S2408). The data processing device 400 sets i=i+1 (step S2409) and returns to step S2405. Upon determining at step S2407 that the color data of the i-th pixel in the second projection image is not the third color data (step S2407: NO), the data processing device 400 proceeds to step S2409.

Upon determining at step S2405 that i<the number of pixels in the first projection image (step S2405: YES), the data processing device 400 outputs the first projection image as the third projection image (step S2410) and proceeds to step S1910.

As described above, the data processing device sets a projection plane between a designation plane that is indicated by designation plane data designated and a facing plane that faces the designation plane. Accordingly, the user can acquire a projection range that is set not to include parts indicated by part data corresponding to the facing plane data that indicate the facing plane. When a through hole passing through in a projection direction is formed in any part of a part group or a clearance is formed by plural parts, the user can detect the through hole or the clearance using a projection image obtained by performing projection based on projection control information. Therefore, the data processing device can enhance setting accuracy of the projection range. Furthermore, the data processing device can reduce a calculation amount of the setting process by setting a projection plane using plane data that are obtained by reducing an information amount from the part data. Accordingly, the data processing device can speed up setting of the projection range.

The data processing device sets the projection plane between the designation plane and the facing plane that is located at a shortest distance from the designation plane. This enables the user to acquire the projection control information not including parts corresponding to the closest facing plane even when the parts are located at the shortest distance. When a through hole passing through in the projection direction is formed in any part of the part group or a clearance is formed by plural parts, the user can detect the through hole or the clearance using the projection image obtained by performing projection based on the projection control information.

The data processing device sets the projection plane in the middle of the designation plane and the facing plane. Accordingly, the user can acquire the projection control information that enables other parts connected to the parts corresponding to the designation plane data to be included in the projection range as much as possible and parts connected to the parts corresponding to the facing plane not to be included in the projection range as much as possible.

The data processing device sets a first set plane between the designation plane and the first facing plane that faces the designation plane, and sets a second set plane between the designation plane and a second facing plane that faces the first facing plane and is located on the opposite side of the designation plane. Accordingly, the user can acquire the projection control information that does not include part data corresponding to the first facing plane and part data corresponding to the second facing plane. When a through hole passing through in the projection direction is formed in any part data of the part data group or a clearance is formed by plural part data, the user can detect the through hole or the clearance using the projection image obtained by performing projection based on the projection control information. Accordingly, the data processing device can speed up the setting of the projection range.

The data processing device sets the projection range between the designation plane and the first set plane located at a shortest distance from the designation plane. Accordingly, the user can acquire the projection control information not including part data corresponding to the closest first facing plane even when the part data are located at the shortest distance. When a through hole passing through in the projection direction is formed in a part indicated by any part data of the part data group or a clearance is formed by plural parts, the user can detect through hole or the clearance using a projection image obtained by performing projection based on the projection control information.

The data processing device sets the first set plane between the designation plane and the first facing plane located at a shortest distance from the designation plane, and sets the second set plane between the designation plane and the second facing plane located at a shortest distance from the designation plane. Accordingly, the user can acquire the projection control information that does not include parts corresponding to facing plane data that indicate the closest first and second facing planes even when the parts are located at the shortest distance. When a through hole passing through in the projection direction is formed in any part of the part group or a clearance is formed by plural parts, the user can detect the through hole or the clearance using a projection image obtained by performing projection based on the projection control information.

The data processing device sets the first set plane in the middle of the designation plane and the first facing plane. Accordingly, the user can acquire the projection control information that enables other parts connected to the parts corresponding to the designation plane data to be included in the projection range as much as possible and parts connected to the parts corresponding to the first facing plane not to be included in the projection range as much as possible.

The data processing device sets the second set plane in the middle of the designation plane and the second facing plane. Accordingly, the user can acquire the projection control information that enables other parts connected to the parts corresponding to the designation plane data to be included in the projection range as much as possible and parts connected to the parts corresponding to the second facing plane not to be included in the projection range as much as possible.

The data processing device performs orthogonal projection in the projection range with enhanced setting accuracy, thereby generating an orthogonal projection image related to the part group included in the projection range. Accordingly, when a through hole passing through in the projection direction is formed in a part indicated by any part data in the part data group or a clearance is formed by plural part data, the user performs projection based on the projection control information. This enables detection of information related to the through hole or the clearance using the projection image.

The data processing device detects hole information from the projection image. Accordingly, the data processing device can enhance reliability of the hole information. As mentioned above, there is the conventional technique that enables to acquire a plane outside of a 3D CAD model including plural parts combined, to check a contact relation between edge lines of parts included in the plane and other planes, and to detect edge lines that do not have a significant contact with other parts and satisfy a predetermined condition as a clearance or a hole.

In the data processing device of the present invention, no contact relation between parts is detected and thus the calculation amount required to detect the hole information can be reduced as compared to the conventional technique. Furthermore, because lines are coarse in the case of polygon data, which is a type of the 3D CAD model, the data processing device has difficulty in detecting the contact relation. In the data processing device of the present invention, there is no great difference in detection results of the hole information between polygon data and other types of the 3D CAD model. Accordingly, the data processing device of the present invention can detect the hole information regardless of types of the 3D CAD model.

The data processing device converts color data of parts into specific color data and converts color data of background information into color data different from the specific color data, before projection. Accordingly, a projection image obtained after projection has different color data between hole portions and part portions and thus the data processing device of the present invention can facilitate a process of detecting the hole information after projection.

Projection cannot be performed in the projection process when a projection plane is not rectangular. However, even when the designation plane is not rectangular, a projection image of parts of the designation plane that is not rectangular can be generated by using rectangular planes enclosing the designation plane. Accordingly, the data processing device of the present invention can detect the hole information related to parts from the projection image related to the parts, regardless of shapes of the parts.

The data processing method described in the present embodiment may be implemented by executing a prepared program on a computer such as a personal computer and a workstation. The program is stored on a computer-readable recording medium such as a hard disk, a flexible disk, a CD-ROM, an MO, and a DVD, read out from the computer-readable medium, and executed by the computer. The program may be distributed through a network such as the Internet.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium storing a program causing a computer to execute a data processing process comprising:
    designating one plane data from a plane data group representing predetermined part data among a plurality of part data expressed three dimensionally;
    setting at a position between a plane indicated by the designated plane data and a facing plane that faces the plane and is indicated by plane data in the plane data group other than the designated plane data, a first set plane that faces the plane;
    setting at a position on an opposite side of the plane from the facing plane, a second set plane that faces the plane;
    acquiring projection control information for projecting in a projection direction from the first set plane toward the second set plane or from the second set plane toward the first set plane, a part group located between the first and second set planes and indicated by a part data group among the plural part data, wherein acquiring the projection control data is based on a normal vector of the designated plane data calculated using the following formulation: $n=(v1-v2)\times(v3-v2)$, where $v1$, $v2$, and $v3$ denote coordinates of vertexes $p1$, $p2$, and $p3$ of the designated plane data, respectively; and
    generating one or more projection image based on the acquired projection control information.

2. The non-transitory computer-readable recording medium according to claim 1, wherein in the setting of the first set plane, includes setting the first set plane at a position between the plane and a facing plane that faces the plane at a shortest distance from the plane.

3. The non-transitory computer-readable recording medium according to claim 1, wherein in the setting of the first set plane, includes setting the first set plane at a position centrally between the plane and a facing plane that faces the plane at a shortest distance from the plane.

4. The non-transitory computer-readable recording medium according to claim 1, wherein
    the setting of the first set plane includes setting at a position between the plane and a first facing plane that faces the plane and is indicated by first plane data in the plane data group other than the designated plane data, the first set plane that faces the plane and the first facing plane, and
    the setting of the second set plane includes setting at a position on an opposite side of the plane from the first facing plane, a second facing plane that is indicated by second plane data in the plane data group and setting at a position between the plane and the second facing plane, the second set plane that faces the plane.

5. The non-transitory computer-readable recording medium according to claim 4, wherein the setting of the first set plane includes setting the first set plane at a position between the plane and the first facing plane located at a shortest distance from the plane.

6. The non-transitory computer-readable recording medium according to claim 5, wherein the setting of the second set plane includes setting at a position between the plane and the second facing plane, the second set plane that faces the plane and the second facing plane located at a shortest distance from the plane on an opposite side of the plane from the first facing plane.

7. The non-transitory computer-readable recording medium according to claim 4, wherein the setting of the first set plane includes setting the first set plane centrally between the plane and the first facing plane.

8. The non-transitory computer-readable recording medium according to claim 4, wherein the setting of the second set plane includes setting the second set plane centrally between the designated plane and the second facing plane.

9. The non-transitory computer-readable recording medium according to claim 1, the data processing process further comprising generating by a projection process and based on the projection control information, a projection image of the part group.

10. The non-transitory computer-readable recording medium according to claim 9, the data processing process further comprising detecting based on the projection image, hole information related to the part group.

11. The non-transitory computer-readable recording medium according to claim 10, the data processing process further comprising converting color information of the part data group into specific color information, wherein
    the generating of the projection image includes projecting in the projection direction, a converted part group indicated by a converted part data group having the color information converted into the specific color information to thereby generate the projection image of the converted part group, and
    the detecting of the hole information includes detecting the hole information from a portion having color information other than the specific color information in the projection image of the converted part group.

12. The non-transitory computer-readable recording medium according to claim 11, wherein
    the generating of the projection image includes projecting in the projection direction, a converted part group having color information converted into the specific color information to thereby generate a first projection image of the converted part group, and projecting in the projection direction, the plane to thereby generate a second projection image, and thus generate a third projection synthesizing the first projection image and the second projection image, and
    the detecting of the hole information includes detecting the hole information from a portion having color information other than the specific color information in the third projection image.

13. A data processing method executed by a computer, the data processing method comprising:
    designating, by the computer, one plane data from a plane data group representing predetermined part data among a plurality of part data expressed three dimensionally;
    setting, by the computer and at a position between a plane indicated by the designated plane data and a facing plane that faces the plane and is indicated by plane data in the plane data group other than the designated plane data, a first set plane that faces the plane indicated by the designated plane data;

setting, by the computer and at a position on an opposite side of the plane from the facing plane, a second set plane that faces the plane; and acquiring projection control information for projecting in a projection direction from the first set plane toward the second set plane or from the second set plane toward the first set plane, a part group located between the first and second set planes and indicated by a part data group among the plural part data, wherein acquiring the projection control data is based on a normal vector of the designated plane data calculated using the following formulation: n=(v1−v2)×(v3−v2), where v1, v2, and v3 denote coordinates of vertexes p1, p2, and p3 of the designated plane data, respectively; and generating one or more projection image based on the acquired projection control information.

14. A data processing device comprising a computer configured to:

designate one plane data from a plane data group representing predetermined part data among a plurality of part data expressed three dimensionally;

set at a position between a plane indicated by the designated plane data and a facing plane that faces the plane and is indicated by plane data in the plane data group other than the designated plane data, a first set plane that faces the plane;

set at a position on an opposite side of the plane from the facing plane, a second set plane that faces the plane; and acquire projection control information for projecting in a projection direction from the first set plane toward the second set plane or from the second set plane toward the first set plane, a part group located between the first and second set planes and indicated by a part data group among the plural part data, wherein acquiring the projection control data is based on a normal vector of the designated plane data calculated using the following formulation: n=(v1−v2)×(v3−v2), where v1, v2, and v3 denote coordinates of vertexes p1, p2, and p3 of the designated plane data, respectively; and generating one or more projection image based on the acquired projection control information.

15. The non-transitory computer-readable recording medium according to claim 1, wherein the facing plane is parallel to the plane indicated by the designated plane data.

* * * * *